US010502802B1

(12) United States Patent
Kadin

(10) Patent No.: US 10,502,802 B1
(45) Date of Patent: Dec. 10, 2019

(54) SYSTEM AND METHOD FOR NOISE REDUCTION IN MAGNETIC RESONANCE IMAGING

(71) Applicant: Hypres, Inc., Elmsford, NY (US)

(72) Inventor: Alan Kadin, Princeton Junction, NJ (US)

(73) Assignee: Hypres, Inc., Elmsford, NY (US)

( * ) Notice: Subject to any disclaimer, the term of this patent is extended or adjusted under 35 U.S.C. 154(b) by 1317 days.

(21) Appl. No.: 14/636,713

(22) Filed: Mar. 3, 2015

Related U.S. Application Data

(63) Continuation of application No. 13/086,793, filed on Apr. 14, 2011, now Pat. No. 8,970,217.

(60) Provisional application No. 61/324,130, filed on Apr. 14, 2010.

(51) Int. Cl.
*G01R 33/48* (2006.01)
*G01R 33/56* (2006.01)
*G01R 33/565* (2006.01)
*G01R 33/54* (2006.01)

(52) U.S. Cl.
CPC ....... *G01R 33/5608* (2013.01); *G01R 33/543* (2013.01); *G01R 33/546* (2013.01); *G01R 33/56518* (2013.01); *G01R 33/56563* (2013.01)

(58) Field of Classification Search
CPC .......................... G01R 33/3621; G01R 33/56; G01R 33/3678; G01R 33/5608; G01R 33/543; G01R 33/546; G01R 33/56563; G01R 33/56518
See application file for complete search history.

(56) References Cited

U.S. PATENT DOCUMENTS 3,801,877 A 4/1974 Griese et al.
4,070,708 A 1/1978 Smallcombe et al.
4,210,861 A 7/1980 Tsuda et al.
(Continued)

OTHER PUBLICATIONS

"Signal-to-noise ratio in MRI", T.W. Redpath, British Journal of Radiology, vol. 71, pp. 704-707 (1998).
(Continued)

*Primary Examiner* — Rishi R Patel
(74) *Attorney, Agent, or Firm* — Tully Rinckey PLLC; Steven M. Hoffberg

(57) ABSTRACT

Signals of interest in magnetic resonance imaging (MRI) systems comprise narrowband, circularly polarized (CP) radio-frequency magnetic fields from rotating atomic nuclei. Background "body noise" may comprise broadband, linearly polarized (LP) magnetic fields from thermally-activated eddy currents, and may exceed the signal in a band of interest, limiting the imaging resolution and requiring excessive averaging times. Noise may be selectively detected and substantially suppressed, while enhancing the signal of interest, using appropriate digital time-domain algorithms. At least two quadrature receiving antennas may be employed to distinguish and separate the LP noise from the CP signal. At least one broadband receiver may be used to identify and localize fast noise sources and to digitally filter the representation of their radio-frequency magnetic fields in the signal. Selective body noise reduction may allow enhanced signal-to-noise ratio of the system, leading to improved imaging resolution and shorter scan time.

18 Claims, 7 Drawing Sheets

(56) References Cited

U.S. PATENT DOCUMENTS

| | | |
|---|---|---|
| 4,344,052 A | 8/1982 | Davidson |
| 4,390,840 A | 6/1983 | Ganssen et al. |
| 4,434,547 A | 3/1984 | Pascal et al. |
| 4,438,400 A | 3/1984 | Patt |
| 4,442,404 A | 4/1984 | Bergmann |
| 4,470,023 A | 9/1984 | Lukens et al. |
| 4,484,138 A | 11/1984 | Bottomley et al. |
| 4,502,008 A | 2/1985 | Ohuchi |
| 4,513,247 A | 4/1985 | Ernst |
| 4,521,733 A | 6/1985 | Bottomley et al. |
| 4,527,124 A | 7/1985 | van Uijen |
| 4,564,811 A | 1/1986 | Walker |
| 4,573,015 A | 2/1986 | Abe et al. |
| 4,585,999 A | 4/1986 | Hilbert et al. |
| 4,588,947 A | 5/1986 | Ketchen |
| 4,591,789 A | 5/1986 | Glover et al. |
| 4,594,550 A | 6/1986 | Yamada et al. |
| 4,594,566 A | 6/1986 | Maudsley |
| 4,617,516 A | 10/1986 | Schenck |
| 4,651,096 A | 3/1987 | Buonocore |
| 4,654,593 A | 3/1987 | Ackerman |
| 4,654,595 A | 3/1987 | Sepponen |
| 4,661,776 A | 4/1987 | Takase |
| 4,672,359 A | 6/1987 | Silver |
| 4,680,545 A | 7/1987 | Gray et al. |
| 4,682,106 A | 7/1987 | Vatis et al. |
| 4,682,107 A | 7/1987 | Bendall et al. |
| 4,684,891 A | 8/1987 | Feinberg |
| 4,695,801 A | 9/1987 | Arakawa et al. |
| 4,701,705 A | 10/1987 | Rollwitz |
| 4,707,664 A | 11/1987 | Fehn et al. |
| 4,733,186 A | 3/1988 | Oppelt et al. |
| 4,739,267 A | 4/1988 | Leroux et al. |
| 4,742,301 A | 5/1988 | van der Meulen et al. |
| 4,751,462 A | 6/1988 | Glover et al. |
| 4,758,429 A | 7/1988 | Gordon |
| 4,769,605 A | 9/1988 | Fox |
| 4,777,443 A | 10/1988 | Yabusaki et al. |
| 4,814,728 A | 3/1989 | Strayer et al. |
| 4,820,983 A | 4/1989 | Bendall et al. |
| 4,843,322 A | 6/1989 | Glover |
| 4,851,777 A | 7/1989 | Macovski |
| 4,853,635 A | 8/1989 | Cuppen |
| 4,857,844 A | 8/1989 | Van Vaals |
| 4,864,237 A | 9/1989 | Hoenig |
| 4,876,507 A | 10/1989 | Van Vaals |
| 4,876,509 A | 10/1989 | Perlmutter |
| 4,879,516 A | 11/1989 | Mehdizadeh et al. |
| 4,885,549 A | 12/1989 | Thrift et al. |
| 4,906,931 A | 3/1990 | Sepponen |
| 4,910,460 A | 3/1990 | Sebok |
| 4,922,203 A | 5/1990 | Sillerud et al. |
| 4,923,850 A | 5/1990 | Stephan et al. |
| RE33,259 E | 7/1990 | Crooks et al. |
| 4,945,308 A | 7/1990 | Doddrell et al. |
| 4,951,674 A | 8/1990 | Zanakis et al. |
| 4,952,877 A | 8/1990 | Stormont et al. |
| 4,977,402 A | 12/1990 | Ko |
| 4,987,368 A | 1/1991 | Vinegar |
| 4,987,369 A | 1/1991 | Van Stapele et al. |
| 4,987,371 A | 1/1991 | Glover et al. |
| 5,019,784 A | 5/1991 | Garwood et al. |
| 5,021,739 A | 6/1991 | Yokosawa et al. |
| 5,023,551 A | 6/1991 | Kleinberg et al. |
| 5,045,788 A | 9/1991 | Hayashi et al. |
| 5,057,776 A | 10/1991 | Macovski |
| 5,065,096 A | 11/1991 | Muck et al. |
| 5,087,605 A | 2/1992 | Hegde et al. |
| 5,099,206 A | 3/1992 | Imaizumi et al. |
| 5,113,137 A * | 5/1992 | Koizumi ............... A61B 6/022 324/307 |
| 5,121,059 A | 6/1992 | Wieland |
| 5,122,746 A | 6/1992 | King et al. |
| 5,140,324 A | 8/1992 | Przybysz et al. |
| 5,143,894 A | 9/1992 | Rothschild et al. |
| 5,151,656 A | 9/1992 | Maier et al. |
| 5,153,171 A | 10/1992 | Smith et al. |
| 5,166,615 A | 11/1992 | Sidles |
| 5,166,616 A | 11/1992 | Doddrell et al. |
| 5,168,227 A | 12/1992 | Foo et al. |
| 5,168,232 A | 12/1992 | Glover et al. |
| 5,170,080 A | 12/1992 | Murphy et al. |
| 5,170,120 A | 12/1992 | Barbara et al. |
| 5,172,060 A | 12/1992 | Knuttel |
| 5,179,332 A | 1/1993 | Kang |
| 5,185,573 A | 2/1993 | Larson, III |
| 5,185,574 A | 2/1993 | Ehman et al. |
| 5,187,327 A | 2/1993 | Ohta et al. |
| 5,192,909 A | 3/1993 | Hardy et al. |
| 5,198,815 A | 3/1993 | Przybysz et al. |
| 5,208,533 A | 5/1993 | Le Roux |
| 5,208,534 A | 5/1993 | Okamoto et al. |
| 5,208,536 A | 5/1993 | Cory |
| 5,211,166 A | 5/1993 | Sepponen |
| 5,212,448 A | 5/1993 | Le Roux et al. |
| 5,214,381 A | 5/1993 | Cory |
| 5,221,899 A | 6/1993 | Gonen et al. |
| 5,221,900 A | 6/1993 | Larson, III |
| 5,227,723 A | 7/1993 | Sepponen |
| 5,227,725 A | 7/1993 | Cory et al. |
| 5,229,718 A | 7/1993 | Cory |
| 5,233,302 A | 8/1993 | Xiang et al. |
| 5,233,992 A | 8/1993 | Holt et al. |
| 5,248,941 A | 9/1993 | Lee et al. |
| 5,250,900 A | 10/1993 | Ehnholm |
| 5,254,950 A | 10/1993 | Fan et al. |
| 5,257,625 A | 11/1993 | Pelc |
| 5,262,724 A | 11/1993 | Tanttu |
| 5,266,844 A | 11/1993 | Ko et al. |
| 5,274,329 A | 12/1993 | Knuttel et al. |
| 5,274,331 A | 12/1993 | Macovski |
| 5,276,398 A | 1/1994 | Withers et al. |
| 5,281,917 A | 1/1994 | Santyr |
| 5,289,400 A | 2/1994 | Przybysz et al. |
| 5,291,138 A | 3/1994 | Macovski |
| 5,300,887 A | 4/1994 | Macovski |
| 5,303,705 A | 4/1994 | Nenov |
| 5,314,681 A | 5/1994 | Leunbach et al. |
| 5,321,358 A | 6/1994 | Mohr et al. |
| 5,321,359 A | 6/1994 | Schneider |
| 5,322,641 A | 6/1994 | Shiel et al. |
| 5,323,110 A | 6/1994 | Fielden et al. |
| 5,325,854 A | 7/1994 | Ehnholm |
| 5,326,986 A | 7/1994 | Miller, Jr. et al. |
| 5,327,085 A | 7/1994 | Cory |
| 5,339,811 A | 8/1994 | Ohta et al. |
| 5,343,147 A | 8/1994 | Sager et al. |
| 5,347,222 A | 9/1994 | Fox et al. |
| 5,351,006 A | 9/1994 | Sumanaweera et al. |
| 5,355,085 A | 10/1994 | Igarashi et al. |
| 5,358,928 A | 10/1994 | Ginley et al. |
| 5,380,704 A | 1/1995 | Tarutani et al. |
| 5,384,109 A | 1/1995 | Klaveness et al. |
| 5,389,877 A | 2/1995 | Sezginer et al. |
| 5,396,242 A | 3/1995 | Lee |
| 5,397,987 A | 3/1995 | Garritano |
| 5,406,947 A | 4/1995 | Kimura |
| 5,408,178 A | 4/1995 | Wikswo, Jr. et al. |
| 5,412,320 A | 5/1995 | Coates |
| 5,420,100 A | 5/1995 | Vittoria et al. |
| 5,420,586 A | 5/1995 | Radparvar |
| 5,426,365 A | 6/1995 | Sekihara et al. |
| 5,429,134 A | 7/1995 | Foo |
| 5,432,445 A | 7/1995 | Dinsmore et al. |
| 5,436,564 A | 7/1995 | Kreger et al. |
| 5,442,290 A | 8/1995 | Crooks |
| 5,451,874 A | 9/1995 | Heflinger |
| 5,456,986 A | 10/1995 | Majetich et al. |
| 5,459,077 A | 10/1995 | Moore et al. |
| 5,467,015 A | 11/1995 | Gotoh |
| 5,475,308 A | 12/1995 | Piotto et al. |
| 5,495,849 A | 3/1996 | Hayashi et al. |
| 5,496,534 A | 3/1996 | Klaveness et al. |
| 5,498,962 A | 3/1996 | Sepponen |

(56) References Cited

U.S. PATENT DOCUMENTS

| | | |
|---|---|---|
| 5,498,963 A | 3/1996 | Schneider et al. |
| 5,517,115 A | 5/1996 | Prammer |
| 5,517,122 A | 5/1996 | Chen |
| 5,543,770 A | 8/1996 | Sasaki et al. |
| 5,548,216 A | 8/1996 | Dumoulin et al. |
| 5,557,199 A | 9/1996 | Bowman et al. |
| 5,560,360 A | 10/1996 | Filler et al. |
| 5,578,922 A | 11/1996 | Lurie et al. |
| 5,586,064 A | 12/1996 | Grupp |
| 5,592,085 A | 1/1997 | Ehman |
| 5,594,849 A | 1/1997 | Kuc et al. |
| 5,600,242 A | 2/1997 | Hubbell |
| 5,600,243 A | 2/1997 | Colclough |
| 5,601,081 A | 2/1997 | Tomita et al. |
| 5,608,320 A | 3/1997 | Dinsmore et al. |
| 5,614,826 A | 3/1997 | Dixon |
| 5,617,876 A | 4/1997 | van Duyl |
| 5,629,624 A | 5/1997 | Carlson et al. |
| 5,646,526 A | 7/1997 | Takeda et al. |
| 5,652,514 A | 7/1997 | Zhang et al. |
| 5,654,636 A | 8/1997 | Sweedler et al. |
| 5,656,937 A | 8/1997 | Cantor |
| 5,657,756 A | 8/1997 | Vrba et al. |
| 5,657,758 A | 8/1997 | Posse et al. |
| 5,671,740 A | 9/1997 | Tomita et al. |
| 5,671,742 A | 9/1997 | Dumoulin et al. |
| 5,677,628 A | 10/1997 | Watanabe et al. |
| 5,682,889 A | 11/1997 | Tomita et al. |
| 5,707,875 A | 1/1998 | Tamura et al. |
| 5,709,208 A | 1/1998 | Posse et al. |
| 5,712,567 A | 1/1998 | Wang |
| 5,729,140 A | 3/1998 | Kruger et al. |
| 5,735,279 A | 4/1998 | Klaveness et al. |
| 5,752,514 A | 5/1998 | Okamura et al. |
| 5,755,227 A | 5/1998 | Tomita et al. |
| 5,756,427 A | 5/1998 | Zhou |
| 5,767,043 A | 6/1998 | Cantor et al. |
| 5,771,893 A | 6/1998 | Kassai et al. |
| 5,771,894 A | 6/1998 | Richards et al. |
| 5,793,210 A | 8/1998 | Pia et al. |
| 5,821,453 A | 10/1998 | Epstein et al. |
| 5,825,185 A | 10/1998 | Liu et al. |
| 5,825,186 A | 10/1998 | Ehman et al. |
| 5,827,501 A | 10/1998 | Jørgensen et al. |
| 5,835,995 A | 11/1998 | Macovski et al. |
| 5,842,986 A | 12/1998 | Avrin et al. |
| 5,844,407 A | 12/1998 | Hubbell |
| 5,867,024 A | 2/1999 | Zhang |
| 5,869,964 A | 2/1999 | Kuhara et al. |
| 5,879,299 A | 3/1999 | Posse et al. |
| 5,885,215 A | 3/1999 | Dossel et al. |
| 5,894,221 A | 4/1999 | Watanabe et al. |
| 5,899,858 A | 5/1999 | Muthupillai et al. |
| 5,903,149 A | 5/1999 | Gonen et al. |
| 5,917,323 A | 6/1999 | Du et al. |
| 5,933,001 A | 8/1999 | Hubbell |
| 5,936,405 A | 8/1999 | Prammer et al. |
| 5,959,453 A | 9/1999 | Taicher et al. |
| 5,977,768 A | 11/1999 | Sezginer et al. |
| 5,982,174 A | 11/1999 | Wagreich et al. |
| 5,994,891 A | 11/1999 | Hubbell |
| 5,998,997 A | 12/1999 | Ramanathan et al. |
| 6,002,254 A | 12/1999 | Kassai et al. |
| 6,005,380 A | 12/1999 | Hubbell |
| 6,005,390 A | 12/1999 | Watanabe et al. |
| 6,008,642 A | 12/1999 | Bulsara et al. |
| 6,008,644 A | 12/1999 | Leunbach et al. |
| 6,011,981 A | 1/2000 | Alvarez et al. |
| 6,016,057 A | 1/2000 | Ma |
| 6,023,161 A | 2/2000 | Dantsker et al. |
| 6,025,718 A | 2/2000 | Hushek |
| 6,028,428 A | 2/2000 | Cunningham et al. |
| 6,031,373 A | 2/2000 | Szeles et al. |
| 6,034,528 A | 3/2000 | Heid |
| 6,046,591 A | 4/2000 | King et al. |
| 6,054,855 A | 4/2000 | Anderson |
| 6,066,948 A | 5/2000 | Seppa |
| 6,066,949 A | 5/2000 | Alley et al. |
| 6,073,040 A | 6/2000 | Kiyuna |
| 6,078,872 A | 6/2000 | Carson et al. |
| 6,081,119 A | 6/2000 | Carson et al. |
| 6,088,611 A | 7/2000 | Lauterbur et al. |
| 6,088,613 A | 7/2000 | Unger |
| 6,091,243 A | 7/2000 | Xiang et al. |
| 6,111,408 A | 8/2000 | Blades et al. |
| 6,111,411 A | 8/2000 | Saranathan et al. |
| 6,118,284 A | 9/2000 | Ghoshal et al. |
| 6,121,774 A | 9/2000 | Sun et al. |
| 6,123,920 A | 9/2000 | Gunther et al. |
| 6,129,668 A | 10/2000 | Haynor et al. |
| 6,133,736 A | 10/2000 | Pervushin et al. |
| 6,144,874 A | 11/2000 | Du |
| 6,147,491 A | 11/2000 | Shen |
| 6,147,492 A | 11/2000 | Zhang et al. |
| 6,150,809 A | 11/2000 | Tiernan et al. |
| 6,154,030 A | 11/2000 | Wurl |
| 6,159,444 A | 12/2000 | Schlenga et al. |
| 6,166,540 A | 12/2000 | Wollin |
| 6,181,131 B1 | 1/2001 | Bruland et al. |
| 6,181,135 B1 | 1/2001 | Shen |
| 6,187,032 B1 | 2/2001 | Ohyu et al. |
| 6,208,884 B1 | 3/2001 | Kumar et al. |
| 6,211,674 B1 | 4/2001 | Cline et al. |
| 6,216,540 B1 | 4/2001 | Nelson et al. |
| 6,225,800 B1 | 5/2001 | Zhang et al. |
| 6,229,308 B1 | 5/2001 | Freedman |
| 6,239,599 B1 | 5/2001 | Zhou et al. |
| 6,242,912 B1 | 6/2001 | Prammer et al. |
| 6,246,897 B1 | 6/2001 | Foo et al. |
| 6,255,820 B1 | 7/2001 | Steckner |
| 6,263,230 B1 | 7/2001 | Haynor et al. |
| 6,275,037 B1 | 8/2001 | Harvey et al. |
| 6,275,039 B1 | 8/2001 | Young et al. |
| 6,275,909 B1 | 8/2001 | Arimilli et al. |
| 6,278,893 B1 | 8/2001 | Ardenkjør-Larson et al. |
| 6,294,914 B1 | 9/2001 | Fiat |
| 6,295,931 B1 | 10/2001 | Cutler et al. |
| 6,298,259 B1 | 10/2001 | Kucharczyk et al. |
| 6,300,760 B1 | 10/2001 | Schubert et al. |
| 6,308,399 B1 | 10/2001 | Zhou |
| 6,311,086 B1 | 10/2001 | Ardenkjaer-Larsen et al. |
| 6,329,819 B1 | 12/2001 | Manduca et al. |
| 6,332,088 B1 | 12/2001 | Zhang et al. |
| 6,333,629 B1 | 12/2001 | Pykett et al. |
| 6,339,626 B1 | 1/2002 | Bernstein et al. |
| 6,348,792 B1 | 2/2002 | Beard et al. |
| 6,359,437 B1 | 3/2002 | Barbara et al. |
| 6,362,617 B1 | 3/2002 | Hubbell |
| 6,366,093 B1 | 4/2002 | Hartman |
| 6,370,414 B1 | 4/2002 | Robinson |
| 6,374,131 B1 | 4/2002 | Tomita et al. |
| 6,377,044 B1 | 4/2002 | Burl et al. |
| 6,377,045 B1 | 4/2002 | Van Den Brink et al. |
| 6,380,742 B1 | 4/2002 | Stringer et al. |
| 6,381,486 B1 | 4/2002 | Mistretta et al. |
| 6,393,313 B1 | 5/2002 | Foo |
| 6,396,267 B1 | 5/2002 | Riek et al. |
| 6,396,271 B1 | 5/2002 | Burl et al. |
| 6,400,153 B1 | 6/2002 | Heid |
| 6,404,197 B1 | 6/2002 | Anderson et al. |
| 6,404,199 B1 | 6/2002 | Fujita et al. |
| 6,408,201 B1 | 6/2002 | Foo et al. |
| 6,418,335 B2 | 7/2002 | Avrin et al. |
| 6,420,873 B1 | 7/2002 | Guthrie |
| 6,433,543 B1 | 8/2002 | Shahinpoor et al. |
| 6,452,391 B1 | 9/2002 | Bernstein et al. |
| 6,452,393 B1 | 9/2002 | Allen et al. |
| 6,453,188 B1 | 9/2002 | Ardenkjaer-Larsen et al. |
| 6,456,071 B1 | 9/2002 | Hennig |
| 6,461,586 B1 | 10/2002 | Unger |
| 6,462,544 B1 | 10/2002 | McKinnon |
| 6,466,814 B1 | 10/2002 | Ardenkjaer-Larsen et al. |
| 6,469,505 B1 | 10/2002 | Maier et al. |
| 6,470,220 B1 | 10/2002 | Kraus, Jr. et al. |

(56) References Cited

U.S. PATENT DOCUMENTS

| | | |
|---|---|---|
| 6,472,870 B1 | 10/2002 | Bendall et al. |
| 6,472,872 B1 | 10/2002 | Jack, Jr. et al. |
| 6,477,398 B1 | 11/2002 | Mills |
| 6,483,306 B2 | 11/2002 | Hahn |
| 6,483,308 B1 | 11/2002 | Ma et al. |
| 6,486,671 B1 | 11/2002 | King |
| 6,487,435 B2 | 11/2002 | Mistretta et al. |
| 6,493,569 B2 | 12/2002 | Foo et al. |
| 6,496,713 B2 | 12/2002 | Avrin et al. |
| 6,509,853 B2 | 1/2003 | Gupta |
| 6,515,478 B1 | 2/2003 | Wicklow et al. |
| 6,522,908 B1 | 2/2003 | Miyashita et al. |
| 6,528,997 B2 | 3/2003 | Zhong et al. |
| 6,531,868 B2 | 3/2003 | Prammer |
| 6,538,442 B2 | 3/2003 | Boskamp |
| 6,538,445 B2 | 3/2003 | James et al. |
| 6,544,170 B1 | 4/2003 | Kajihara et al. |
| 6,549,799 B2 | 4/2003 | Bock et al. |
| 6,556,856 B1 | 4/2003 | Mistretta et al. |
| 6,564,081 B1 | 5/2003 | Frigo et al. |
| 6,570,383 B1 | 5/2003 | McKinnon et al. |
| 6,574,495 B1 | 6/2003 | Golman et al. |
| 6,574,496 B1 | 6/2003 | Golman et al. |
| 6,574,852 B2 | 6/2003 | Zhou |
| 6,583,622 B1 | 6/2003 | Hills |
| 6,583,624 B1 | 6/2003 | Muthupillai et al. |
| 6,593,740 B1 | 7/2003 | Van Den Brink et al. |
| 6,608,581 B1 | 8/2003 | Semenov |
| 6,614,047 B2 | 9/2003 | Tzalenchuk et al. |
| 6,617,167 B2 | 9/2003 | Otvos et al. |
| 6,617,850 B2 | 9/2003 | Welch et al. |
| 6,618,605 B1 | 9/2003 | Wolff et al. |
| 6,630,828 B1 | 10/2003 | Mistretta et al. |
| 6,636,040 B1 | 10/2003 | Eydelman |
| 6,646,065 B2 | 11/2003 | Schrotz et al. |
| 6,650,116 B2 | 11/2003 | Garwood et al. |
| 6,653,832 B2 | 11/2003 | Wind et al. |
| 6,653,833 B2 | 11/2003 | Baumgartl et al. |
| 6,670,811 B2 | 12/2003 | Wind et al. |
| 6,674,282 B2 | 1/2004 | Pines et al. |
| 6,681,131 B2 | 1/2004 | Kandori et al. |
| 6,681,132 B1 | 1/2004 | Katz et al. |
| 6,683,451 B1 | 1/2004 | Moore et al. |
| 6,690,162 B1 | 2/2004 | Schopohl et al. |
| 6,690,167 B2 | 2/2004 | Reiderman et al. |
| 6,697,660 B1 | 2/2004 | Robinson |
| 6,700,372 B2 | 3/2004 | Blumich et al. |
| 6,703,835 B2 | 3/2004 | Patch et al. |
| 6,707,299 B2 | 3/2004 | Shah et al. |
| 6,713,195 B2 | 3/2004 | Wang et al. |
| 6,720,074 B2 | 4/2004 | Zhang et al. |
| 6,724,188 B2 | 4/2004 | Butters et al. |
| 6,727,697 B2 | 4/2004 | Fiat |
| 6,734,673 B2 | 5/2004 | Agrikola |
| 6,741,879 B2 | 5/2004 | Chang |
| 6,747,451 B2 | 6/2004 | Alzner |
| 6,750,650 B2 | 6/2004 | Kiefer et al. |
| 6,756,237 B2 | 6/2004 | Xiao et al. |
| 6,768,302 B2 | 7/2004 | Vester |
| 6,771,071 B1 | 8/2004 | Wright et al. |
| 6,791,109 B2 | 9/2004 | Tzalenchuk et al. |
| 6,791,321 B2 | 9/2004 | Willig-Onwuachi et al. |
| 6,794,867 B1 | 9/2004 | Block et al. |
| 6,803,761 B2 | 10/2004 | Prammer et al. |
| 6,806,713 B2 | 10/2004 | Wong |
| 6,812,484 B2 | 11/2004 | Tzalenchuk et al. |
| 6,822,255 B2 | 11/2004 | Tzalenchuk et al. |
| 6,822,444 B2 | 11/2004 | Lai |
| 6,825,655 B2 | 11/2004 | Minchole et al. |
| 6,833,700 B2 | 12/2004 | Lee et al. |
| 6,836,115 B2 | 12/2004 | Wind et al. |
| 6,838,875 B2 | 1/2005 | Freedman |
| 6,838,964 B1 | 1/2005 | Knight et al. |
| 6,841,995 B2 | 1/2005 | Weitekamp |
| 6,841,997 B2 | 1/2005 | Feiweier |
| 6,845,262 B2 | 1/2005 | Albert et al. |
| 6,847,209 B2 | 1/2005 | Shenoy et al. |
| 6,853,187 B2 | 2/2005 | Fainchtein |
| 6,853,189 B1 | 2/2005 | Pipe |
| 6,853,190 B2 | 2/2005 | Nittka et al. |
| 6,865,494 B2 | 3/2005 | Duensing et al. |
| 6,873,153 B2 | 3/2005 | Frydman |
| 6,876,199 B2 | 4/2005 | Hardy et al. |
| 6,884,739 B2 | 4/2005 | Ahn et al. |
| 6,885,192 B2 | 4/2005 | Clarke et al. |
| 6,888,350 B2 | 5/2005 | Deimling |
| 6,891,371 B1 | 5/2005 | Frigo et al. |
| 6,891,372 B2 | 5/2005 | Steinhoff et al. |
| 6,891,373 B2 | 5/2005 | Deimling |
| 6,897,654 B2 | 5/2005 | Barbic |
| 6,903,548 B2 | 6/2005 | Foo |
| 6,914,428 B2 | 7/2005 | Dixon et al. |
| 6,915,152 B2 | 7/2005 | Zhu |
| 6,919,579 B2 | 7/2005 | Amin et al. |
| 6,930,479 B2 | 8/2005 | Xiao et al. |
| 6,937,014 B2 | 8/2005 | Sun et al. |
| 6,946,838 B2 | 9/2005 | Corver et al. |
| 6,946,839 B2 | 9/2005 | Porter |
| 6,949,490 B2 | 9/2005 | Zhou |
| 6,954,067 B2 | 10/2005 | Mistretta |
| 6,958,609 B2 | 10/2005 | Raftery et al. |
| 6,971,391 B1 | 12/2005 | Wang et al. |
| 6,972,374 B2 | 12/2005 | Adrian et al. |
| 6,987,282 B2 | 1/2006 | Amin et al. |
| 6,992,484 B2 | 1/2006 | Frank |
| 6,997,863 B2 | 2/2006 | Handy et al. |
| 7,002,341 B2 | 2/2006 | Baudenbacher et al. |
| 7,015,693 B2 | 3/2006 | Corver et al. |
| 7,023,207 B1 | 4/2006 | Gaddipati et al. |
| 7,026,694 B2 | 4/2006 | Ahn et al. |
| 7,034,532 B1 | 4/2006 | Shenoy |
| 7,038,450 B2 | 5/2006 | Romalis et al. |
| 7,042,216 B2 | 5/2006 | Barbic |
| 7,042,218 B2 | 5/2006 | Sellers |
| 7,053,410 B2 | 5/2006 | Kurashina et al. |
| 7,053,610 B2 | 5/2006 | Clarke et al. |
| 7,057,387 B2 | 6/2006 | Duensing et al. |
| 7,061,237 B2 | 6/2006 | Pines et al. |
| 7,064,545 B2 | 6/2006 | Zaharchuk et al. |
| 7,078,130 B2 | 7/2006 | Antonelli |
| 7,078,897 B2 | 7/2006 | Yablonskiy et al. |
| 7,081,749 B2 | 7/2006 | Macovski |
| 7,091,412 B2 | 8/2006 | Wang et al. |
| 7,092,748 B2 | 8/2006 | Valdes Sosa et al. |
| 7,106,057 B2 | 9/2006 | Matthews et al. |
| 7,109,711 B2 | 9/2006 | Kiefer |
| 7,115,706 B2 | 10/2006 | Hollingsworth et al. |
| 7,116,102 B2 | 10/2006 | Clarke et al. |
| 7,117,102 B2 | 10/2006 | Filikov |
| 7,119,540 B1 | 10/2006 | Shenoy et al. |
| 7,123,952 B2 | 10/2006 | Nakai et al. |
| 7,126,333 B2 | 10/2006 | Beard et al. |
| 7,127,294 B1 | 10/2006 | Wang et al. |
| 7,129,881 B2 | 10/2006 | Franz |
| 7,130,675 B2 | 10/2006 | Ewing et al. |
| 7,141,971 B2 | 11/2006 | Duensing et al. |
| 7,144,376 B2 | 12/2006 | Nakai et al. |
| 7,145,330 B2 | 12/2006 | Xiao |
| 7,145,333 B2 | 12/2006 | Romalis et al. |
| 7,145,334 B2 | 12/2006 | Assmann et al. |
| 7,148,685 B2 | 12/2006 | Block et al. |
| 7,162,302 B2 | 1/2007 | Wang et al. |
| 7,176,684 B2 | 2/2007 | Patch et al. |
| 7,180,418 B1 | 2/2007 | Willms et al. |
| 7,187,169 B2 | 3/2007 | Clarke et al. |
| 7,193,415 B2 | 3/2007 | Barbic et al. |
| 7,197,352 B2 | 3/2007 | Gott et al. |
| 7,197,353 B2 | 3/2007 | King et al. |
| 7,199,581 B2 | 4/2007 | Corver et al. |
| 7,202,665 B1 | 4/2007 | Reeder |
| 7,202,667 B2 | 4/2007 | Barbic |
| 7,205,763 B2 | 4/2007 | Porter |
| 7,205,764 B1 | 4/2007 | Anderson et al. |
| 7,218,104 B2 | 5/2007 | Clarke et al. |

(56) References Cited

U.S. PATENT DOCUMENTS

| | | |
|---|---|---|
| 7,225,674 B2 | 6/2007 | Clark |
| 7,227,356 B1 | 6/2007 | Hariharan et al. |
| 7,235,972 B2 | 6/2007 | Shah et al. |
| 7,242,190 B1 | 7/2007 | Shenoy |
| 7,245,124 B2 | 7/2007 | Shu et al. |
| 7,248,044 B2 | 7/2007 | Kobayashi et al. |
| 7,250,762 B2 | 7/2007 | King et al. |
| 7,251,519 B2 | 7/2007 | Axelsson et al. |
| 7,262,597 B2 | 8/2007 | Woods et al. |
| 7,268,548 B2 | 9/2007 | Sellers |
| 7,279,893 B1 | 10/2007 | Marinelli et al. |
| 7,280,861 B2 | 10/2007 | Thomas et al. |
| 7,280,863 B2 | 10/2007 | Shachar |
| 7,283,862 B1 | 10/2007 | Slavin et al. |
| 7,332,908 B2 | 2/2008 | Nayak et al. |
| 7,336,073 B2 | 2/2008 | Patch et al. |
| 7,339,375 B1 | 3/2008 | Shenoy |
| 7,343,193 B2 | 3/2008 | Block et al. |
| 7,352,180 B2 | 4/2008 | Manneschi |
| 7,358,727 B1 | 4/2008 | Angelos |
| 7,363,070 B2 | 4/2008 | Ogata et al. |
| 7,365,534 B2 | 4/2008 | Tralshawala et al. |
| 7,365,663 B2 | 4/2008 | Rylov et al. |
| 7,366,560 B2 | 4/2008 | Taicher et al. |
| 7,369,093 B2 | 5/2008 | Oppenlander et al. |
| 7,375,519 B2 | 5/2008 | Zur |
| 7,375,522 B2 | 5/2008 | Reeder |
| 7,378,844 B2 | 5/2008 | Watkins et al. |
| 7,382,129 B2 | 6/2008 | Mills |
| 7,385,395 B2 | 6/2008 | Pines et al. |
| 7,385,396 B2 | 6/2008 | Zhu |
| 7,388,375 B2 | 6/2008 | Haase |
| 7,391,213 B2 | 6/2008 | Watkins et al. |
| 7,394,251 B2 | 7/2008 | Lin |
| 7,394,252 B1 | 7/2008 | Lin |
| 7,395,107 B2 | 7/2008 | Ishiyama et al. |
| 7,395,108 B2 | 7/2008 | Roopchansingh et al. |
| 7,397,242 B2 | 7/2008 | Samsonov et al. |
| 7,408,346 B2 | 8/2008 | Szyperski et al. |
| 7,408,347 B2 | 8/2008 | Mistretta et al. |
| 7,420,369 B2 | 9/2008 | Van Den Brink et al. |
| 7,420,687 B2 | 9/2008 | Pfaff |
| 7,423,426 B2 | 9/2008 | Reiderman |
| 7,429,862 B2 | 9/2008 | Kholmovski et al. |
| 7,439,194 B2 | 10/2008 | Ahn et al. |
| 7,443,719 B2 | 10/2008 | Kirichenko et al. |
| 7,446,526 B2 | 11/2008 | Cunningham et al. |
| 7,466,132 B2 | 12/2008 | Clarke et al. |
| 7,474,095 B2 | 1/2009 | Levitt et al. |
| 7,474,097 B2 | 1/2009 | Bydder et al. |
| 7,477,053 B2 | 1/2009 | Pinsky et al. |
| 7,479,782 B2 | 1/2009 | Van Den Brink |
| 7,482,805 B2 | 1/2009 | Feiweier |
| 7,482,806 B2 | 1/2009 | Stemmer et al. |
| 7,482,807 B2 | 1/2009 | Gleich et al. |
| 7,485,366 B2 | 2/2009 | Ma et al. |
| 7,486,075 B2 | 2/2009 | Brau et al. |
| 7,492,153 B2 | 2/2009 | Brau et al. |
| 7,495,437 B2 | 2/2009 | Griswold et al. |
| 7,495,439 B2 | 2/2009 | Wiggins |
| 7,499,894 B2 | 3/2009 | Marom et al. |
| 7,508,213 B2 | 3/2009 | Koste |
| 7,511,489 B2 | 3/2009 | Fautz et al. |
| 7,519,412 B2 | 4/2009 | Mistretta |
| 7,521,708 B1 | 4/2009 | Agassi |
| 7,521,928 B2 | 4/2009 | Romalis et al. |
| 7,525,314 B1 | 4/2009 | Heiland |
| 7,533,068 B2 | 5/2009 | Maassen van den Brink et al. |
| 7,535,228 B2 | 5/2009 | Tiernan et al. |
| 7,538,548 B2 | 5/2009 | Avram et al. |
| 7,541,806 B2 | 6/2009 | Appelt et al. |
| 7,547,400 B1 | 6/2009 | Carpenter et al. |
| 7,550,970 B2 | 6/2009 | Servin et al. |
| 7,550,972 B1 | 6/2009 | Maier et al. |
| 7,560,289 B2 | 7/2009 | Hong et al. |
| 7,561,909 B1 | 7/2009 | Pai et al. |
| 7,570,054 B1 | 8/2009 | Lin |
| 7,573,264 B2 | 8/2009 | Xu et al. |
| 7,573,267 B1 | 8/2009 | Mallozzi et al. |
| 7,573,268 B2 | 8/2009 | Volegov et al. |
| 7,583,992 B2 | 9/2009 | Mistretta et al. |
| 7,586,306 B2 | 9/2009 | Szyperski et al. |
| 7,587,231 B2 | 9/2009 | Zhang |
| 7,592,808 B1 | 9/2009 | King |
| 7,592,809 B1 | 9/2009 | King et al. |
| 7,598,897 B2 | 10/2009 | Kirichenko |
| 7,602,179 B2 | 10/2009 | van der Kouwe et al. |
| 7,602,184 B2 | 10/2009 | Du |
| 7,602,186 B2 | 10/2009 | Hoogeveen |
| 7,603,158 B2 | 10/2009 | Nachman et al. |
| 7,609,058 B2 | 10/2009 | Laub et al. |
| 7,609,060 B2 | 10/2009 | Hetherington et al. |
| 7,622,924 B2 | 11/2009 | Hwang |
| 7,624,088 B2 | 11/2009 | Johnson et al. |
| 7,631,507 B2 | 12/2009 | Stautner |
| 7,635,977 B2 | 12/2009 | Pipe |
| 7,639,007 B2 | 12/2009 | Hutton et al. |
| 7,647,098 B2 | 1/2010 | Prichep |
| 7,649,353 B2 | 1/2010 | Feiweier et al. |
| 7,659,124 B2 | 2/2010 | Pusiol |
| 7,659,718 B1 | 2/2010 | Lustig et al. |
| 7,667,457 B2 | 2/2010 | Linz et al. |
| 7,671,587 B2 | 3/2010 | Penanen et al. |
| 7,671,590 B2 | 3/2010 | Hariharan et al. |
| 7,671,593 B2 | 3/2010 | Goldhaber et al. |
| 7,683,614 B2 | 3/2010 | Posse |
| 7,683,615 B2 | 3/2010 | Song |
| 7,688,068 B2 | 3/2010 | Beatty |
| 7,688,069 B2 | 3/2010 | Kraus et al. |
| 7,688,070 B2 | 3/2010 | Weyers et al. |
| 7,689,262 B2 | 3/2010 | Kruger et al. |
| 7,692,425 B2 | 4/2010 | Brau et al. |
| 7,693,569 B1 | 4/2010 | Brittain et al. |
| 7,696,751 B2 | 4/2010 | Molyneaux et al. |
| 7,701,209 B1 | 4/2010 | Green |
| 7,706,855 B1 | 4/2010 | Priatna et al. |
| 7,719,269 B2 | 5/2010 | Petersson et al. |
| 7,728,592 B2 | 6/2010 | Ma et al. |
| 7,728,748 B1 | 6/2010 | Kirichenko |
| 7,728,958 B2 | 6/2010 | Pfaff |
| 7,741,844 B2 | 6/2010 | Hancu et al. |
| 7,747,304 B2 | 6/2010 | Gleich |
| 7,750,633 B2 | 7/2010 | Pines et al. |
| 7,755,356 B1 | 7/2010 | Shenoy |
| 7,769,424 B2 | 8/2010 | Sato |
| 7,772,842 B2 | 8/2010 | Gao et al. |
| 7,773,230 B2 | 8/2010 | Pfaff |
| 7,777,485 B2 | 8/2010 | Dumoulin et al. |
| 7,791,339 B2 | 9/2010 | Wong et al. |
| 7,795,868 B2 | 9/2010 | Larson et al. |
| 7,795,869 B1 | 9/2010 | Bydder |
| 7,800,367 B2 | 9/2010 | Bhardwaj et al. |
| 7,807,474 B2 | 10/2010 | Jesmanowicz |
| 7,816,916 B2 | 10/2010 | Fasano et al. |
| 7,821,262 B2 | 10/2010 | Kannengiesser et al. |
| 7,830,144 B2 | 11/2010 | Duerk et al. |
| 7,834,622 B2 | 11/2010 | Reiderman et al. |
| 7,841,986 B2 | 11/2010 | He et al. |
| 7,844,656 B2 | 11/2010 | Macready et al. |
| 7,857,767 B2 | 12/2010 | Ferren et al. |
| 7,863,892 B2 | 1/2011 | Morley et al. |
| 7,869,854 B2 | 1/2011 | Shachar et al. |
| 7,873,402 B2 | 1/2011 | Shachar |
| 7,902,820 B2 | 3/2011 | Vervaeke et al. |
| 7,906,345 B2 | 3/2011 | Wang et al. |
| 7,906,962 B2 | 3/2011 | Han et al. |
| 7,912,656 B2 | 3/2011 | Berns et al. |
| 7,917,189 B2 | 3/2011 | Mistretta |
| 7,932,719 B2 | 4/2011 | Liimatainen et al. |
| 7,952,351 B2 | 5/2011 | King et al. |
| 7,952,354 B2 | 5/2011 | Petersson et al. |
| 7,953,174 B2 | 5/2011 | Asbeck et al. |
| 7,974,679 B2 | 7/2011 | Zhou |
| 7,977,943 B2 | 7/2011 | Marinelli et al. |

(56) References Cited

U.S. PATENT DOCUMENTS

| | | |
|---|---|---|
| 7,986,991 B2 | 7/2011 | Prichep |
| 7,998,060 B2 | 8/2011 | Ferren et al. |
| 7,999,541 B2 | 8/2011 | Chisholm et al. |
| 8,000,767 B2 | 8/2011 | Eden et al. |
| 8,000,784 B2 | 8/2011 | Ferren et al. |
| 8,008,914 B2 | 8/2011 | Penanen et al. |
| 8,008,942 B2 | 8/2011 | van den Brink et al. |
| 8,012,945 B2 | 9/2011 | Hallahan et al. |
| 8,019,413 B2 | 9/2011 | Ferren et al. |
| 8,022,703 B1 | 9/2011 | Huang et al. |
| 8,024,036 B2 | 9/2011 | Ferren et al. |
| 8,027,714 B2 | 9/2011 | Shachar |
| 8,030,920 B2 | 10/2011 | Vu et al. |
| 8,030,923 B2 | 10/2011 | Yu et al. |
| 8,030,926 B2 | 10/2011 | Avdievich et al. |
| 8,032,209 B2 | 10/2011 | He et al. |
| 8,040,521 B2 | 10/2011 | Pfaff |
| 8,046,046 B2 | 10/2011 | Chan et al. |
| 8,054,073 B2 | 11/2011 | Tuchman |
| 8,058,872 B2 | 11/2011 | Hyde et al. |
| 8,060,179 B1 | 11/2011 | Flynn |
| 8,060,180 B2 | 11/2011 | Pai |
| 8,063,636 B2 | 11/2011 | Hyde et al. |
| 8,064,982 B2 | 11/2011 | Hu et al. |
| 8,072,212 B2 | 12/2011 | Park |
| 8,072,219 B2 | 12/2011 | Saito et al. |
| 8,076,938 B2 | 12/2011 | Brau et al. |
| 8,085,041 B2 | 12/2011 | Aksit et al. |
| 8,089,278 B1 | 1/2012 | Du |
| 8,093,056 B2 | 1/2012 | Ganesan |
| 8,093,899 B2 | 1/2012 | Barmet et al. |
| 8,106,655 B2 | 1/2012 | Hyde et al. |
| 8,111,068 B2 | 2/2012 | Duerk et al. |
| 8,118,754 B1 | 2/2012 | Flynn et al. |
| 8,128,908 B2 | 3/2012 | Santra et al. |
| 8,130,002 B2 | 3/2012 | Tateishi et al. |
| 8,143,072 B2 | 3/2012 | Lukaszew et al. |
| 8,145,295 B2 | 3/2012 | Boyden et al. |
| 8,148,979 B1 | 4/2012 | Du |
| 8,148,982 B2 | 4/2012 | Witschey et al. |
| 8,154,285 B1 | 4/2012 | Hyde et al. |
| 8,163,896 B1 | 4/2012 | Bentwich |
| 8,164,333 B2 | 4/2012 | Rugar et al. |
| 8,165,657 B2 | 4/2012 | Krueger |
| 8,168,570 B2 | 5/2012 | Barron et al. |
| 8,169,231 B2 | 5/2012 | Berkley |
| 8,170,316 B2 | 5/2012 | Barbic et al. |
| 8,179,133 B1 | 5/2012 | Kornev et al. |
| 8,179,135 B2 | 5/2012 | Hahn et al. |
| 8,188,735 B2 | 5/2012 | Derakhshan et al. |
| 8,188,737 B2 | 5/2012 | Saha |
| 8,195,274 B2 | 6/2012 | Wong |
| 8,212,554 B2 | 7/2012 | Brazdeikis et al. |
| 8,212,866 B2 | 7/2012 | Lemmer et al. |
| 8,222,899 B2 | 7/2012 | Horng et al. |
| 8,228,060 B2 | 7/2012 | Busse |
| 8,237,441 B2 | 8/2012 | Martinez-Moller et al. |
| 8,242,778 B2 | 8/2012 | Subramanian et al. |
| 8,244,192 B2 | 8/2012 | Prasidh et al. |
| 8,244,328 B2 | 8/2012 | Biber et al. |
| 8,248,069 B2 | 8/2012 | Buracas |
| 8,274,283 B2 | 9/2012 | Liu et al. |
| 8,278,925 B2 | 10/2012 | Sun et al. |
| 8,283,943 B2 | 10/2012 | van den Brink et al. |
| 8,285,351 B2 | 10/2012 | Johnson et al. |
| 8,305,078 B2 | 11/2012 | Savukov et al. |
| 8,310,233 B2 | 11/2012 | Trzasko et al. |
| 8,318,093 B2 | 11/2012 | Wang et al. |
| 8,319,495 B1 | 11/2012 | Zhu |
| 8,332,010 B2 | 12/2012 | Edelman |
| 8,334,690 B2 | 12/2012 | Kitching et al. |
| 8,350,568 B2 | 1/2013 | Hwang et al. |
| 8,350,804 B1 | 1/2013 | Moll |
| 8,362,769 B2 | 1/2013 | Hughes et al. |
| 8,368,380 B2 | 2/2013 | Berkcan et al. |
| 8,372,654 B2 | 2/2013 | Cook et al. |
| 8,373,415 B2 | 2/2013 | Reeder et al. |
| 8,386,013 B2 | 2/2013 | Du et al. |
| 8,386,554 B2 | 2/2013 | Macready et al. |
| 8,390,286 B2 | 3/2013 | Matlashov et al. |
| 8,405,823 B2 | 3/2013 | Pfaff |
| 8,421,457 B2 | 4/2013 | Jacobson et al. |
| 8,427,145 B2 | 4/2013 | Mitchell et al. |
| 8,427,147 B2 | 4/2013 | Block et al. |
| 8,427,160 B2 | 4/2013 | Fishbein |
| 8,433,392 B2 | 4/2013 | Riederer |
| 8,436,612 B2 | 5/2013 | Deimling |
| 8,436,613 B2 | 5/2013 | Feiweier |
| 8,446,149 B2 | 5/2013 | Heberlein |
| 8,456,163 B2 | 6/2013 | Zhao |
| 8,456,164 B2 | 6/2013 | Subbarao |
| 8,471,558 B2 | 6/2013 | Chisholm et al. |
| 8,471,559 B2 | 6/2013 | Taherian et al. |
| 8,483,798 B2 | 7/2013 | Petersson et al. |
| 8,487,623 B2 | 7/2013 | Penanen et al. |
| 8,502,536 B2 | 8/2013 | Block et al. |
| 8,502,538 B2 | 8/2013 | Dannels et al. |
| 8,508,229 B2 | 8/2013 | Ehman et al. |
| 8,512,219 B2 | 8/2013 | Ferren et al. |
| 8,519,705 B2 | 8/2013 | Savukov et al. |
| 8,527,031 B2 | 9/2013 | Yu et al. |
| 8,536,862 B2 | 9/2013 | Kimura et al. |
| 8,536,867 B2 | 9/2013 | Biber |
| 8,547,090 B2 | 10/2013 | Lukin et al. |
| 8,547,095 B2 | 10/2013 | Budker et al. |
| 8,554,294 B2 | 10/2013 | Kim et al. |
| 8,560,282 B2 | 10/2013 | Macready et al. |
| 8,564,288 B2 | 10/2013 | Jannin et al. |
| 8,570,035 B2 | 10/2013 | Wemmer et al. |
| 8,581,580 B2 | 11/2013 | Maida, Jr. et al. |
| 8,581,583 B2 | 11/2013 | Greiser |
| 8,587,309 B2 | 11/2013 | Jellus |
| 8,593,141 B1 | 11/2013 | Radparvar et al. |
| 8,598,871 B2 | 12/2013 | Bahn |
| 8,604,772 B2 | 12/2013 | Berkcan et al. |
| 8,610,435 B2 | 12/2013 | Sambandamurthy et al. |
| 8,618,799 B1 | 12/2013 | Radparvar et al. |
| 8,624,594 B2 | 1/2014 | Fujiwara et al. |
| 8,653,818 B2 | 2/2014 | Adalsteinsson et al. |
| 8,660,642 B2 | 2/2014 | Ferren et al. |
| 8,686,724 B2 | 4/2014 | Mitchell et al. |
| 8,686,725 B2 | 4/2014 | Iannotti et al. |
| 8,686,751 B2 | 4/2014 | van den Brink et al. |
| 8,694,092 B2 | 4/2014 | Ferren et al. |
| 8,697,034 B2 | 4/2014 | Kovacs et al. |
| 8,698,496 B2 | 4/2014 | Sorensen et al. |
| 8,698,498 B2 | 4/2014 | Penanen et al. |
| 8,704,518 B2 | 4/2014 | Alsop et al. |
| 8,710,843 B2 | 4/2014 | Carlone et al. |
| 8,723,514 B2 | 5/2014 | Finkler et al. |
| 8,729,453 B2 | 5/2014 | Worschech et al. |
| 8,736,823 B2 | 5/2014 | Pfaff |
| 8,742,754 B2 | 6/2014 | Hasan |
| 8,749,233 B2 | 6/2014 | Littmann et al. |
| 8,754,644 B2 | 6/2014 | Trakic et al. |
| 8,754,645 B2 | 6/2014 | Gross et al. |
| 8,760,159 B2 | 6/2014 | Tuchman |
| 8,766,631 B2 | 7/2014 | Hofmann et al. |
| 8,766,633 B2 | 7/2014 | Bhattacharya et al. |
| 8,773,126 B2 | 7/2014 | Kuge et al. |
| 8,779,768 B2 | 7/2014 | Brey et al. |
| 8,781,197 B2 | 7/2014 | Wang et al. |
| 8,781,542 B2 | 7/2014 | Tsukamoto et al. |
| 8,791,700 B2 | 7/2014 | Witschey et al. |
| 8,823,374 B2 | 9/2014 | Weller et al. |
| 8,823,375 B2 | 9/2014 | Banerjee et al. |
| 8,836,329 B2 | 9/2014 | Weinberg |
| 8,838,200 B2 | 9/2014 | Good |
| 8,854,038 B2 | 10/2014 | Hernando et al. |
| 8,854,074 B2 | 10/2014 | Berkley |
| 8,872,515 B2 | 10/2014 | Sun |
| 8,883,423 B2 | 11/2014 | Neely |
| 8,886,283 B1 | 11/2014 | Chen et al. |
| 8,890,528 B2 | 11/2014 | Delforge et al. |

(56) References Cited

U.S. PATENT DOCUMENTS

| | | |
|---|---|---|
| 8,922,209 B2 | 12/2014 | Alford et al. |
| 8,928,317 B2 | 1/2015 | Sun |
| 8,933,695 B1 | 1/2015 | Kornev et al. |
| 8,933,697 B2 | 1/2015 | Chen et al. |
| 8,947,080 B2 | 2/2015 | Lukin et al. |
| 8,952,691 B2 | 2/2015 | Blumich et al. |
| 8,970,217 B1 | 3/2015 | Kadin |
| 8,975,893 B2 | 3/2015 | Greiser et al. |
| 8,975,895 B2 | 3/2015 | Sutton et al. |
| 8,981,778 B2 | 3/2015 | Lee et al. |
| 8,988,075 B2 | 3/2015 | Grodzki |
| 8,999,650 B2 | 4/2015 | Flynn et al. |
| 9,011,329 B2 | 4/2015 | Ferren et al. |
| 9,013,184 B2 | 4/2015 | Zuehlsdorff et al. |
| 9,020,576 B2 | 4/2015 | Nagatani |
| 9,035,650 B2 | 5/2015 | Popescu |
| 9,046,493 B2 | 6/2015 | Neely et al. |
| 9,057,713 B2 | 6/2015 | Dawson |
| 9,069,928 B2 | 6/2015 | van den Brink et al. |
| 9,095,270 B2 | 8/2015 | Flynn |
| 9,097,751 B1 | 8/2015 | Longhini et al. |
| 9,101,276 B2 | 8/2015 | Georgopoulos |
| 9,121,889 B2 | 9/2015 | Tuchman |
| 9,140,657 B2 | 9/2015 | Ledbetter et al. |
| 9,167,979 B2 | 10/2015 | Skidmore et al. |
| 9,179,827 B2 | 11/2015 | Hastings et al. |
| 9,198,563 B2 | 12/2015 | Ferren et al. |
| 9,211,083 B2 | 12/2015 | Graziani et al. |
| 9,229,080 B2 | 1/2016 | Lin |
| 9,254,097 B2 | 2/2016 | Espy et al. |
| 9,261,573 B1 | 2/2016 | Radparvar et al. |
| 9,279,863 B2 | 3/2016 | Tsukamoto et al. |
| 9,326,751 B2 | 5/2016 | Hastings |
| 9,339,562 B2 | 5/2016 | Chen et al. |
| 9,360,457 B2 | 6/2016 | Neely et al. |
| 9,618,591 B1 | 4/2017 | Radparvar et al. |
| 2001/0033163 A1 | 10/2001 | Sigal et al. |
| 2001/0037062 A1 | 11/2001 | Ehnholm |
| 2001/0038284 A1 | 11/2001 | Hahn |
| 2001/0054897 A1 | 12/2001 | Taicher et al. |
| 2001/0056232 A1 | 12/2001 | Lardo et al. |
| 2002/0060635 A1 | 5/2002 | Gupta |
| 2002/0062076 A1 | 5/2002 | Kandori et al. |
| 2002/0077537 A1 | 6/2002 | Avrin et al. |
| 2002/0087063 A1 | 7/2002 | Lou |
| 2002/0093335 A1 | 7/2002 | Miller et al. |
| 2002/0095765 A1 | 7/2002 | Zhou |
| 2002/0117656 A1 | 8/2002 | Amin et al. |
| 2002/0117738 A1 | 8/2002 | Amin et al. |
| 2002/0121636 A1 | 9/2002 | Amin et al. |
| 2002/0128689 A1 | 9/2002 | Connelly et al. |
| 2002/0128691 A1 | 9/2002 | Connelly |
| 2002/0133086 A1 | 9/2002 | Connelly et al. |
| 2002/0133199 A1 | 9/2002 | MacDonald et al. |
| 2002/0133200 A1 | 9/2002 | Weiner et al. |
| 2002/0133201 A1 | 9/2002 | Connelly et al. |
| 2002/0133202 A1 | 9/2002 | Connelly et al. |
| 2002/0133208 A1 | 9/2002 | Connelly |
| 2002/0133211 A1 | 9/2002 | Weiner et al. |
| 2002/0133216 A1 | 9/2002 | Connelly et al. |
| 2002/0138102 A1 | 9/2002 | Weiner et al. |
| 2002/0138107 A1 | 9/2002 | Weiner et al. |
| 2002/0138108 A1 | 9/2002 | Weiner et al. |
| 2002/0138110 A1 | 9/2002 | Connelly et al. |
| 2002/0138112 A1 | 9/2002 | Connelly et al. |
| 2002/0138113 A1 | 9/2002 | Connelly et al. |
| 2002/0138124 A1 | 9/2002 | Helfer et al. |
| 2002/0140425 A1 | 10/2002 | Prammer et al. |
| 2002/0143258 A1 | 10/2002 | Weiner et al. |
| 2002/0146580 A1 | 10/2002 | Wang et al. |
| 2002/0147470 A1 | 10/2002 | Weiner et al. |
| 2002/0149364 A1 | 10/2002 | Edwards |
| 2002/0173716 A1 | 11/2002 | Alzner |
| 2002/0175682 A1 | 11/2002 | Chen et al. |
| 2002/0177769 A1 | 11/2002 | Orbach et al. |
| 2002/0183796 A1 | 12/2002 | Connelly |
| 2002/0190717 A1 | 12/2002 | Leussler et al. |
| 2002/0193680 A1 | 12/2002 | Feiweier |
| 2002/0196017 A1 | 12/2002 | Akkurt et al. |
| 2002/0196021 A1 | 12/2002 | Wang |
| 2002/0198450 A1 | 12/2002 | Reykowski |
| 2002/0198569 A1 | 12/2002 | Foster et al. |
| 2003/0001569 A1 | 1/2003 | Chen et al. |
| 2003/0006766 A1 | 1/2003 | Kruspe et al. |
| 2003/0006768 A1 | 1/2003 | Kleinberg et al. |
| 2003/0009111 A1 | 1/2003 | Cory et al. |
| 2003/0011366 A1 | 1/2003 | Minh et al. |
| 2003/0016010 A1 | 1/2003 | Kandori et al. |
| 2003/0016012 A1 | 1/2003 | Coates et al. |
| 2003/0016013 A1 | 1/2003 | Kruspe et al. |
| 2003/0016017 A1 | 1/2003 | Reykowski et al. |
| 2003/0028095 A1 | 2/2003 | Tulley et al. |
| 2003/0032995 A1 | 2/2003 | Handy et al. |
| 2003/0052677 A1 | 3/2003 | Pines et al. |
| 2003/0058502 A1 | 3/2003 | Griffiths et al. |
| 2003/0062894 A1 | 4/2003 | Vester |
| 2003/0062900 A1 | 4/2003 | Kiefer et al. |
| 2003/0069495 A1 | 4/2003 | Agrikola |
| 2003/0071620 A1 | 4/2003 | Reiderman et al. |
| 2003/0076087 A1 | 4/2003 | Minchole et al. |
| 2003/0077224 A1 | 4/2003 | Pines et al. |
| 2003/0085702 A1 | 5/2003 | Freed et al. |
| 2003/0088172 A1 | 5/2003 | Kuth |
| 2003/0092981 A1 | 5/2003 | Deimling |
| 2003/0093004 A1 | 5/2003 | Sosa et al. |
| 2003/0097058 A1 | 5/2003 | Nittka et al. |
| 2003/0099271 A1 | 5/2003 | Maksimov et al. |
| 2003/0111659 A1 | 6/2003 | Tzalenchuk et al. |
| 2003/0111661 A1 | 6/2003 | Tzalenchuk et al. |
| 2003/0122545 A1 | 7/2003 | Van Den Brink et al. |
| 2003/0129405 A1 | 7/2003 | Zhang et al. |
| 2003/0130127 A1 | 7/2003 | Hentges et al. |
| 2003/0130190 A1 | 7/2003 | Hallahan et al. |
| 2003/0146429 A1 | 8/2003 | Tzalenchuk et al. |
| 2003/0146430 A1 | 8/2003 | Tzalenchuk et al. |
| 2003/0146750 A1 | 8/2003 | Vaughan |
| 2003/0149354 A1 | 8/2003 | Bakharev |
| 2003/0159847 A1 | 8/2003 | Adrian et al. |
| 2003/0160622 A1 | 8/2003 | Duensing et al. |
| 2003/0169032 A1 | 9/2003 | Minchole et al. |
| 2003/0178994 A1 | 9/2003 | Hurlimann et al. |
| 2003/0184293 A1 | 10/2003 | Boskamp et al. |
| 2003/0199395 A1 | 10/2003 | Zhou |
| 2003/0201772 A1 | 10/2003 | Sigal et al. |
| 2003/0210043 A1 | 11/2003 | Freedman |
| 2003/0214296 A1* | 11/2003 | Carlini ............... G01R 33/389 324/309 |
| 2003/0214297 A1 | 11/2003 | Kruger |
| 2004/0000905 A1 | 1/2004 | Freedman et al. |
| 2004/0002645 A1 | 1/2004 | Ewing et al. |
| 2004/0002648 A1 | 1/2004 | Engelhard et al. |
| 2004/0017193 A1 | 1/2004 | Speier |
| 2004/0027123 A1 | 2/2004 | Heaton |
| 2004/0027125 A1 | 2/2004 | Clarke et al. |
| 2004/0027127 A1 | 2/2004 | Mills |
| 2004/0030242 A1 | 2/2004 | Weber |
| 2004/0055745 A1 | 3/2004 | Georgi et al. |
| 2004/0066194 A1 | 4/2004 | Slade et al. |
| 2004/0077493 A1 | 4/2004 | Antonelli |
| 2004/0116800 A1 | 6/2004 | Helfer et al. |
| 2004/0119471 A1 | 6/2004 | Blanz et al. |
| 2004/0140799 A1 | 7/2004 | Romalis et al. |
| 2004/0140803 A1 | 7/2004 | Deimling |
| 2004/0140808 A1 | 7/2004 | Vaughan |
| 2004/0152969 A1 | 8/2004 | Zhang et al. |
| 2004/0158144 A1 | 8/2004 | Keren et al. |
| 2004/0164840 A1 | 8/2004 | Xiao et al. |
| 2004/0193038 A1 | 9/2004 | Reykowski et al. |
| 2004/0193040 A1 | 9/2004 | Brill et al. |
| 2004/0199067 A1 | 10/2004 | Bock et al. |
| 2004/0199069 A1 | 10/2004 | Connelly et al. |
| 2004/0199071 A1 | 10/2004 | Lardo et al. |
| 2004/0207396 A1 | 10/2004 | Xiao |
| 2004/0222789 A1 | 11/2004 | Pinsky et al. |

(56) References Cited

U.S. PATENT DOCUMENTS

| | | |
|---|---|---|
| 2004/0225210 A1 | 11/2004 | Brosovich et al. |
| 2004/0230271 A1 | 11/2004 | Wang et al. |
| 2004/0239318 A1 | 12/2004 | Xiao et al. |
| 2004/0239319 A1 | 12/2004 | Tralshawala et al. |
| 2004/0249428 A1 | 12/2004 | Wang et al. |
| 2004/0251042 A1 | 12/2004 | Weiner et al. |
| 2004/0254419 A1 | 12/2004 | Wang et al. |
| 2004/0254443 A1 | 12/2004 | Gott et al. |
| 2004/0257078 A1 | 12/2004 | Porter |
| 2005/0001619 A1 | 1/2005 | Kiefer |
| 2005/0017715 A1 | 1/2005 | Prammer et al. |
| 2005/0017719 A1 | 1/2005 | Heubes |
| 2005/0020933 A1 | 1/2005 | Sato |
| 2005/0021019 A1 | 1/2005 | Hashimshony et al. |
| 2005/0024051 A1* | 2/2005 | Doddrell ............. A61B 5/7257 324/307 |
| 2005/0024054 A1 | 2/2005 | Rinneberg et al. |
| 2005/0025797 A1 | 2/2005 | Wang et al. |
| 2005/0033154 A1 | 2/2005 | deCharms |
| 2005/0033156 A1 | 2/2005 | Kruger et al. |
| 2005/0041746 A1 | 2/2005 | Rosen et al. |
| 2005/0052650 A1 | 3/2005 | Wu |
| 2005/0057248 A1 | 3/2005 | Woods et al. |
| 2005/0074600 A1 | 4/2005 | Ma et al. |
| 2005/0079132 A1 | 4/2005 | Wang et al. |
| 2005/0084031 A1 | 4/2005 | Rosen et al. |
| 2005/0084032 A1 | 4/2005 | Rosen et al. |
| 2005/0084033 A1 | 4/2005 | Rosen et al. |
| 2005/0090732 A1 | 4/2005 | Ivkov et al. |
| 2005/0096589 A1 | 5/2005 | Shachar |
| 2005/0100076 A1 | 5/2005 | Gazdzinski |
| 2005/0100102 A1 | 5/2005 | Gazdzinski |
| 2005/0100930 A1 | 5/2005 | Wang et al. |
| 2005/0104587 A1 | 5/2005 | Akkurt |
| 2005/0107681 A1 | 5/2005 | Griffiths |
| 2005/0107684 A1 | 5/2005 | Weyers et al. |
| 2005/0113669 A1 | 5/2005 | Helfer et al. |
| 2005/0113676 A1 | 5/2005 | Weiner et al. |
| 2005/0113873 A1 | 5/2005 | Weiner et al. |
| 2005/0113874 A1 | 5/2005 | Connelly et al. |
| 2005/0113876 A1 | 5/2005 | Weiner et al. |
| 2005/0134262 A1 | 6/2005 | Clarke et al. |
| 2005/0137092 A1 | 6/2005 | Mester et al. |
| 2005/0140369 A1 | 6/2005 | Feiweier et al. |
| 2005/0149002 A1 | 7/2005 | Wang et al. |
| 2005/0149169 A1 | 7/2005 | Wang et al. |
| 2005/0156593 A1 | 7/2005 | Assmann et al. |
| 2005/0159661 A1 | 7/2005 | Connelly et al. |
| 2005/0165295 A1 | 7/2005 | Li et al. |
| 2005/0165471 A1 | 7/2005 | Wang et al. |
| 2005/0171421 A1 | 8/2005 | Eden et al. |
| 2005/0174201 A1 | 8/2005 | Luong et al. |
| 2005/0182319 A1 | 8/2005 | Glossop |
| 2005/0182482 A1 | 8/2005 | Wang et al. |
| 2005/0187458 A1 | 8/2005 | Kannengiesser et al. |
| 2005/0202570 A1 | 9/2005 | Pusiol |
| 2005/0206376 A1 | 9/2005 | Matthews et al. |
| 2005/0206377 A1 | 9/2005 | Romalis et al. |
| 2005/0209430 A1 | 9/2005 | Hollingsworth et al. |
| 2005/0216075 A1 | 9/2005 | Wang et al. |
| 2005/0225326 A1 | 10/2005 | He et al. |
| 2005/0234329 A1 | 10/2005 | Kraus, Jr. et al. |
| 2005/0237057 A1 | 10/2005 | Porter |
| 2005/0237059 A1 | 10/2005 | Reykowski |
| 2005/0240100 A1 | 10/2005 | Wang et al. |
| 2005/0241394 A1 | 11/2005 | Clark |
| 2005/0261574 A1 | 11/2005 | Li et al. |
| 2005/0261763 A1 | 11/2005 | Wang et al. |
| 2005/0270031 A1 | 12/2005 | Oppelt et al. |
| 2005/0272158 A1 | 12/2005 | Galford et al. |
| 2005/0278020 A1 | 12/2005 | Wang et al. |
| 2005/0283167 A1 | 12/2005 | Gray |
| 2005/0283168 A1 | 12/2005 | Gray |
| 2005/0283213 A1 | 12/2005 | Gray |
| 2005/0283214 A1 | 12/2005 | Gray |
| 2005/0288750 A1 | 12/2005 | Gray |
| 2005/0288751 A1 | 12/2005 | Gray |
| 2005/0288752 A1 | 12/2005 | Gray |
| 2005/0288753 A1 | 12/2005 | Gray |
| 2005/0288754 A1 | 12/2005 | Gray |
| 2005/0288755 A1 | 12/2005 | Gray |
| 2005/0288756 A1 | 12/2005 | Gray |
| 2005/0288757 A1 | 12/2005 | Gray |
| 2006/0001423 A1 | 1/2006 | Barbic |
| 2006/0012369 A1 | 1/2006 | Neufeld et al. |
| 2006/0020371 A1 | 1/2006 | Ham et al. |
| 2006/0020403 A1 | 1/2006 | Pusiol |
| 2006/0033491 A1 | 2/2006 | Blanz et al. |
| 2006/0033501 A1 | 2/2006 | Vaughan |
| 2006/0038564 A1 | 2/2006 | Findeklee |
| 2006/0052250 A1 | 3/2006 | Schrieffer |
| 2006/0061362 A1 | 3/2006 | Reykowski |
| 2006/0091881 A1 | 5/2006 | Clarke et al. |
| 2006/0095220 A1 | 5/2006 | Vrba et al. |
| 2006/0102871 A1 | 5/2006 | Wang et al. |
| 2006/0117397 A1 | 6/2006 | Rutkowski et al. |
| 2006/0132127 A1 | 6/2006 | Fullerton |
| 2006/0145694 A1 | 7/2006 | Oppenlander et al. |
| 2006/0148104 A1 | 7/2006 | Marini et al. |
| 2006/0164088 A1 | 7/2006 | Hawkes |
| 2006/0170410 A1 | 8/2006 | Bjorn |
| 2006/0173284 A1 | 8/2006 | Ackerman et al. |
| 2006/0176054 A1 | 8/2006 | Clarke et al. |
| 2006/0186882 A1 | 8/2006 | Walsh |
| 2006/0192554 A1 | 8/2006 | Blanz et al. |
| 2006/0192559 A1 | 8/2006 | Ardenkjaer-Larsen et al. |
| 2006/0220647 A1 | 10/2006 | Doty |
| 2006/0225165 A1 | 10/2006 | Maassen van den Brink et al. |
| 2006/0234648 A1 | 10/2006 | Tuccillo |
| 2006/0241384 A1 | 10/2006 | Fisher et al. |
| 2006/0241392 A1 | 10/2006 | Feinstein et al. |
| 2006/0246143 A1 | 11/2006 | Ege |
| 2006/0249705 A1 | 11/2006 | Wang et al. |
| 2006/0251303 A1 | 11/2006 | He et al. |
| 2006/0255799 A1 | 11/2006 | Reiderman |
| 2006/0261810 A1 | 11/2006 | Fautz et al. |
| 2006/0264738 A1 | 11/2006 | Hashimshony et al. |
| 2006/0272812 A1 | 12/2006 | Yu et al. |
| 2006/0273787 A1 | 12/2006 | Blanz |
| 2006/0279282 A1 | 12/2006 | Van Den Brink |
| 2006/0284812 A1 | 12/2006 | Griswold et al. |
| 2007/0007964 A1 | 1/2007 | Vaughan |
| 2007/0010702 A1 | 1/2007 | Wang et al. |
| 2007/0013376 A1 | 1/2007 | Heid et al. |
| 2007/0016003 A1 | 1/2007 | Piron et al. |
| 2007/0016006 A1 | 1/2007 | Shachar |
| 2007/0018643 A1 | 1/2007 | Clarke et al. |
| 2007/0020701 A1 | 1/2007 | Menon et al. |
| 2007/0027532 A1 | 2/2007 | Wang et al. |
| 2007/0038067 A1 | 2/2007 | Kandori et al. |
| 2007/0046287 A1 | 3/2007 | Vervaeke et al. |
| 2007/0080341 A1 | 4/2007 | Macready et al. |
| 2007/0085534 A1 | 4/2007 | Seki et al. |
| 2007/0086121 A1 | 4/2007 | Nagase et al. |
| 2007/0100251 A1 | 5/2007 | Prichep |
| 2007/0106150 A1 | 5/2007 | Greiser et al. |
| 2007/0114994 A1 | 5/2007 | Kobayashi et al. |
| 2007/0132529 A1 | 6/2007 | Luong et al. |
| 2007/0132581 A1 | 6/2007 | Molyneaux et al. |
| 2007/0135803 A1 | 6/2007 | Belson |
| 2007/0164737 A1 | 7/2007 | Pusiol |
| 2007/0166730 A1 | 7/2007 | Menon et al. |
| 2007/0167723 A1 | 7/2007 | Park et al. |
| 2007/0174227 A1 | 7/2007 | Johnson et al. |
| 2007/0182408 A1 | 8/2007 | Blanz et al. |
| 2007/0191705 A1 | 8/2007 | Deshpande et al. |
| 2007/0194225 A1 | 8/2007 | Zorn |
| 2007/0197891 A1 | 8/2007 | Shachar et al. |
| 2007/0205767 A1 | 9/2007 | Xu et al. |
| 2007/0222433 A1 | 9/2007 | Tiernan et al. |
| 2007/0222443 A1 | 9/2007 | Blanz |
| 2007/0222444 A1 | 9/2007 | Reiderman |
| 2007/0222447 A1 | 9/2007 | Van Der Brink et al. |
| 2007/0222448 A1 | 9/2007 | Fullerton |

(56) References Cited

U.S. PATENT DOCUMENTS

| | | |
|---|---|---|
| 2007/0225634 A1 | 9/2007 | Ferren et al. |
| 2007/0229080 A1 | 10/2007 | Weiss et al. |
| 2007/0236219 A1 | 10/2007 | Deimling et al. |
| 2007/0238973 A1 | 10/2007 | Krueger |
| 2007/0241750 A1 | 10/2007 | Akkurt |
| 2007/0241751 A1 | 10/2007 | Kholmovski et al. |
| 2007/0244520 A1 | 10/2007 | Ferren et al. |
| 2007/0247160 A1 | 10/2007 | Vaughan |
| 2007/0252595 A1 | 11/2007 | Volegov et al. |
| 2007/0270703 A1 | 11/2007 | He et al. |
| 2007/0273374 A1 | 11/2007 | Haase |
| 2007/0276218 A1 | 11/2007 | Yellen |
| 2007/0279061 A1 | 12/2007 | Erickson et al. |
| 2007/0282378 A1 | 12/2007 | Huang et al. |
| 2007/0290688 A1 | 12/2007 | Vaughan |
| 2008/0001600 A1 | 1/2008 | deCharms |
| 2008/0027313 A1 | 1/2008 | Shachar |
| 2008/0033569 A1 | 2/2008 | Ferren et al. |
| 2008/0054904 A1 | 3/2008 | Neufeld et al. |
| 2008/0074113 A1 | 3/2008 | Clarke et al. |
| 2008/0082270 A1 | 4/2008 | Heaton et al. |
| 2008/0088305 A1 | 4/2008 | Olson et al. |
| 2008/0091118 A1 | 4/2008 | Georgopoulos |
| 2008/0091193 A1 | 4/2008 | Kauphusman et al. |
| 2008/0094064 A1 | 4/2008 | Eberler et al. |
| 2008/0100175 A1 | 5/2008 | Clark |
| 2008/0103440 A1 | 5/2008 | Ferren et al. |
| 2008/0104966 A1 | 5/2008 | Stautner |
| 2008/0106261 A1 | 5/2008 | Romalis et al. |
| 2008/0116892 A1 | 5/2008 | Laub et al. |
| 2008/0119156 A1 | 5/2008 | Hotto |
| 2008/0129289 A1 | 6/2008 | Stemmer et al. |
| 2008/0129298 A1 | 6/2008 | Vaughan et al. |
| 2008/0139919 A1 | 6/2008 | Kannengiesser et al. |
| 2008/0144900 A1 | 6/2008 | Li et al. |
| 2008/0150525 A1 | 6/2008 | Song |
| 2008/0157769 A1 | 7/2008 | Renz et al. |
| 2008/0174309 A1 | 7/2008 | Pusiol et al. |
| 2008/0174313 A1 | 7/2008 | Ganesan |
| 2008/0174314 A1 | 7/2008 | Holwell et al. |
| 2008/0204013 A1 | 8/2008 | Badry et al. |
| 2008/0231281 A1 | 9/2008 | Fain et al. |
| 2008/0234937 A1 | 9/2008 | Fang et al. |
| 2008/0255006 A1 | 10/2008 | Wang et al. |
| 2008/0278167 A1 | 11/2008 | Vaughan, Jr. |
| 2008/0284433 A1 | 11/2008 | Kraus, Jr. et al. |
| 2008/0290869 A1 | 11/2008 | Hutton et al. |
| 2008/0309339 A1 | 12/2008 | Chisholm et al. |
| 2008/0309340 A1 | 12/2008 | Cho et al. |
| 2009/0002717 A1 | 1/2009 | Pfaff |
| 2009/0004748 A1 | 1/2009 | Ganesan |
| 2009/0009414 A1 | 1/2009 | Reykowski |
| 2009/0015256 A1 | 1/2009 | Bottomley et al. |
| 2009/0024050 A1 | 1/2009 | Jung et al. |
| 2009/0029392 A1 | 1/2009 | Josephson et al. |
| 2009/0072824 A1 | 3/2009 | Romero |
| 2009/0072828 A1 | 3/2009 | Penanen et al. |
| 2009/0078931 A1 | 3/2009 | Berkley |
| 2009/0079427 A1 | 3/2009 | Deimling |
| 2009/0085565 A1 | 4/2009 | Fullerton |
| 2009/0087064 A1 | 4/2009 | Barbic et al. |
| 2009/0093962 A1 | 4/2009 | Akkurt |
| 2009/0121712 A1 | 5/2009 | Han et al. |
| 2009/0128144 A1 | 5/2009 | Freedman et al. |
| 2009/0128272 A1 | 5/2009 | Hills |
| 2009/0131737 A1 | 5/2009 | Ferren et al. |
| 2009/0131738 A1 | 5/2009 | Ferren et al. |
| 2009/0134873 A1 | 5/2009 | Cho et al. |
| 2009/0136104 A1 | 5/2009 | Hajian et al. |
| 2009/0149736 A1 | 6/2009 | Skidmore et al. |
| 2009/0160439 A1 | 6/2009 | Fishbein |
| 2009/0167342 A1 | 7/2009 | van den Brink et al. |
| 2009/0174407 A1 | 7/2009 | Han et al. |
| 2009/0177075 A1 | 7/2009 | Derakhshan et al. |
| 2009/0179636 A1 | 7/2009 | Chen |
| 2009/0179642 A1 | 7/2009 | Decharms |
| 2009/0184282 A1 | 7/2009 | Carpenter et al. |
| 2009/0187096 A1 | 7/2009 | Tiernan et al. |
| 2009/0189604 A1 | 7/2009 | Romero |
| 2009/0219019 A1 | 9/2009 | Taherian et al. |
| 2009/0221900 A1 | 9/2009 | Ikushima et al. |
| 2009/0227044 A1 | 9/2009 | Dosev et al. |
| 2009/0232510 A1 | 9/2009 | Gupta et al. |
| 2009/0246142 A1 | 10/2009 | Bhatia et al. |
| 2009/0248014 A1 | 10/2009 | Shachar et al. |
| 2009/0261826 A1 | 10/2009 | Pines et al. |
| 2009/0266887 A1 | 10/2009 | Molyneaux et al. |
| 2009/0278538 A1 | 11/2009 | Chen et al. |
| 2009/0288820 A1 | 11/2009 | Barron et al. |
| 2009/0289629 A1 | 11/2009 | Tuchman |
| 2009/0295389 A1 | 12/2009 | Pruessmann et al. |
| 2009/0302841 A1 | 12/2009 | Avdievich et al. |
| 2009/0302844 A1 | 12/2009 | Saito et al. |
| 2009/0302845 A1 | 12/2009 | Biber |
| 2009/0309594 A1 | 12/2009 | Feiweier et al. |
| 2009/0311970 A1 | 12/2009 | Tuccillo |
| 2009/0315802 A1 | 12/2009 | Johansen et al. |
| 2010/0006439 A1 | 1/2010 | Ham et al. |
| 2010/0052683 A1 | 3/2010 | Huber |
| 2010/0066360 A1 | 3/2010 | Fasano et al. |
| 2010/0066367 A1 | 3/2010 | Ma et al. |
| 2010/0066368 A1 | 3/2010 | Gao et al. |
| 2010/0073000 A1 | 3/2010 | Ludwig et al. |
| 2010/0079908 A1 | 4/2010 | Heidmann |
| 2010/0085050 A1 | 4/2010 | Dong et al. |
| 2010/0088033 A1 | 4/2010 | Chen et al. |
| 2010/0091292 A1 | 4/2010 | Pfaff |
| 2010/0094155 A1 | 4/2010 | Prichep |
| 2010/0097056 A1 | 4/2010 | Lam et al. |
| 2010/0109638 A1 | 5/2010 | Berns et al. |
| 2010/0109669 A1 | 5/2010 | Penanen et al. |
| 2010/0117652 A1 | 5/2010 | Cork et al. |
| 2010/0118600 A1 | 5/2010 | Nagase et al. |
| 2010/0121180 A1 | 5/2010 | Biber et al. |
| 2010/0148773 A1 | 6/2010 | Chen et al. |
| 2010/0148776 A1 | 6/2010 | Subramanian et al. |
| 2010/0148778 A1 | 6/2010 | Biber |
| 2010/0156416 A1 | 6/2010 | Martinez-Moller et al. |
| 2010/0160767 A1 | 6/2010 | Deimling |
| 2010/0164489 A1 | 7/2010 | Lukaszew et al. |
| 2010/0179619 A1 | 7/2010 | Gray |
| 2010/0182004 A1 | 7/2010 | Prammer |
| 2010/0207622 A1 | 8/2010 | Finkler et al. |
| 2010/0219819 A1 | 9/2010 | Kimura et al. |
| 2010/0219820 A1 | 9/2010 | Skidmore et al. |
| 2010/0219827 A1 | 9/2010 | Matlashov et al. |
| 2010/0225313 A1 | 9/2010 | Blanz |
| 2010/0225317 A1 | 9/2010 | Biber |
| 2010/0231483 A1 | 9/2010 | Bazih et al. |
| 2010/0239142 A1 | 9/2010 | Dannels et al. |
| 2010/0239151 A1 | 9/2010 | Dannels et al. |
| 2010/0249572 A1 | 9/2010 | Weiss |
| 2010/0253089 A1 | 10/2010 | Huang et al. |
| 2010/0253338 A1 | 10/2010 | Eryaman et al. |
| 2010/0253339 A1 | 10/2010 | Gross |
| 2010/0253340 A1 | 10/2010 | Corum et al. |
| 2010/0253348 A1 | 10/2010 | Wiggins |
| 2010/0253350 A1 | 10/2010 | Huish et al. |
| 2010/0253351 A1 | 10/2010 | Huish et al. |
| 2010/0253353 A1 | 10/2010 | Cork et al. |
| 2010/0260677 A1 | 10/2010 | Bhatia et al. |
| 2010/0264916 A1 | 10/2010 | Pusiol |
| 2010/0264921 A1 | 10/2010 | Horng et al. |
| 2010/0271019 A1 | 10/2010 | Anand et al. |
| 2010/0271023 A1 | 10/2010 | Deimling |
| 2010/0277167 A1 | 11/2010 | Romero |
| 2010/0283459 A1 | 11/2010 | Kruspe et al. |
| 2010/0283460 A1 | 11/2010 | Kruspe et al. |
| 2010/0283461 A1 | 11/2010 | Kruspe et al. |
| 2010/0295692 A1 | 11/2010 | Bjorn |
| 2010/0301855 A1 | 12/2010 | Hyde et al. |
| 2010/0301856 A1 | 12/2010 | Hyde et al. |

(56) References Cited

U.S. PATENT DOCUMENTS

| | | |
|---|---|---|
| 2010/0301857 A1 | 12/2010 | Hyde et al. |
| 2010/0303731 A1 | 12/2010 | Hyde et al. |
| 2010/0303733 A1 | 12/2010 | Hyde et al. |
| 2010/0308813 A1 | 12/2010 | Lukin et al. |
| 2010/0308814 A1 | 12/2010 | Wu |
| 2010/0315079 A1 | 12/2010 | Lukin et al. |
| 2010/0331665 A1 | 12/2010 | Ladebeck |
| 2011/0001478 A1 | 1/2011 | Wemmer et al. |
| 2011/0010412 A1 | 1/2011 | Macready et al. |
| 2011/0012596 A1 | 1/2011 | Menon et al. |
| 2011/0037468 A1 | 2/2011 | Bottomley et al. |
| 2011/0043653 A1 | 2/2011 | Ikeno et al. |
| 2011/0044524 A1 | 2/2011 | Wang et al. |
| 2011/0047201 A1 | 2/2011 | Macready et al. |
| 2011/0054236 A1 | 3/2011 | Yang et al. |
| 2011/0054345 A1 | 3/2011 | Nagatani |
| 2011/0057653 A1 | 3/2011 | Barmatz et al. |
| 2011/0062957 A1 | 3/2011 | Fu et al. |
| 2011/0068789 A1 | 3/2011 | Hwang et al. |
| 2011/0068853 A1 | 3/2011 | Worschech et al. |
| 2011/0074403 A1 | 3/2011 | Horng et al. |
| 2011/0082383 A1 | 4/2011 | Cory et al. |
| 2011/0109308 A1 | 5/2011 | Pusiol et al. |
| 2011/0109310 A1 | 5/2011 | Hornung |
| 2011/0109313 A1 | 5/2011 | Subramanian et al. |
| 2011/0115486 A1 | 5/2011 | Frohlich et al. |
| 2011/0121833 A1 | 5/2011 | Sambandamurthy et al. |
| 2011/0144479 A1 | 6/2011 | Hastings et al. |
| 2011/0150779 A1 | 6/2011 | Han et al. |
| 2011/0156706 A1 | 6/2011 | Stubbs et al. |
| 2011/0166438 A1 | 7/2011 | Emerson et al. |
| 2011/0175604 A1 | 7/2011 | Polzer et al. |
| 2011/0175605 A1 | 7/2011 | Kim et al. |
| 2011/0184681 A1 | 7/2011 | Augustine et al. |
| 2011/0190619 A1 | 8/2011 | Good |
| 2011/0204891 A1 | 8/2011 | Drake et al. |
| 2011/0210728 A1 | 9/2011 | Somasundaram et al. |
| 2011/0210738 A1 | 9/2011 | Penanen et al. |
| 2011/0215807 A1 | 9/2011 | Misic et al. |
| 2011/0234219 A1 | 9/2011 | Boehi et al. |
| 2011/0234220 A1 | 9/2011 | Mitchell et al. |
| 2011/0248714 A1 | 10/2011 | Salomir et al. |
| 2011/0275880 A1 | 11/2011 | Ferren et al. |
| 2011/0279115 A1 | 11/2011 | Tuchman |
| 2011/0298489 A1 | 12/2011 | van den Brink et al. |
| 2011/0301039 A1 | 12/2011 | Johnson et al. |
| 2011/0301448 A1 | 12/2011 | deCharms |
| 2012/0001656 A1 | 1/2012 | Hu et al. |
| 2012/0008381 A1 | 1/2012 | Nagase et al. |
| 2012/0019246 A1 | 1/2012 | Kannengiesser et al. |
| 2012/0025832 A1 | 2/2012 | Schmidig |
| 2012/0032678 A1 | 2/2012 | Vaughan, Jr. et al. |
| 2012/0041297 A1 | 2/2012 | McGary |
| 2012/0049844 A1 | 3/2012 | Leveridge et al. |
| 2012/0053666 A1 | 3/2012 | Ferren et al. |
| 2012/0062232 A1 | 3/2012 | Matschl et al. |
| 2012/0068701 A1 | 3/2012 | Chisholm et al. |
| 2012/0068704 A1 | 3/2012 | Popescu |
| 2012/0074941 A1 | 3/2012 | Grodzki |
| 2012/0092011 A1 | 4/2012 | Kickhefel et al. |
| 2012/0098540 A1 | 4/2012 | Biber et al. |
| 2012/0105061 A1 | 5/2012 | Drake et al. |
| 2012/0109241 A1 | 5/2012 | Rauscher |
| 2012/0119739 A1 | 5/2012 | Gleich |
| 2012/0126809 A1 | 5/2012 | Hopper et al. |
| 2012/0133464 A1 | 5/2012 | Nagel et al. |
| 2012/0133922 A1 | 5/2012 | Pfaff |
| 2012/0143127 A1 | 6/2012 | Shachar |
| 2012/0157319 A1 | 6/2012 | Tsukamoto et al. |
| 2012/0165912 A1 | 6/2012 | Gray |
| 2012/0169340 A1 | 7/2012 | Leussler et al. |
| 2012/0172704 A1 | 7/2012 | Piron et al. |
| 2012/0174684 A1 | 7/2012 | Pusiol |
| 2012/0176130 A1 | 7/2012 | Ledbetter et al. |
| 2012/0181020 A1 | 7/2012 | Barron et al. |
| 2012/0182013 A1 | 7/2012 | Biber et al. |
| 2012/0187950 A1 | 7/2012 | Biber et al. |
| 2012/0220853 A1 | 8/2012 | Ikushima et al. |
| 2012/0223709 A1 | 9/2012 | Schillak et al. |
| 2012/0223711 A1 | 9/2012 | Weinberg |
| 2012/0235677 A1 | 9/2012 | Blanz et al. |
| 2012/0235683 A1 | 9/2012 | Weiland |
| 2012/0252678 A1 | 10/2012 | Kim et al. |
| 2012/0256630 A1 | 10/2012 | Leussler et al. |
| 2012/0262174 A1 | 10/2012 | Voigt et al. |
| 2012/0268115 A1 | 10/2012 | Pusiol et al. |
| 2012/0268172 A1 | 10/2012 | Quinsat et al. |
| 2012/0271153 A1 | 10/2012 | Assmann et al. |
| 2012/0271154 A1 | 10/2012 | Assmann et al. |
| 2012/0286777 A1 | 11/2012 | Frost et al. |
| 2012/0306493 A1 | 12/2012 | Voigt et al. |
| 2012/0306494 A1 | 12/2012 | Yang et al. |
| 2012/0306496 A1 | 12/2012 | Popescu |
| 2013/0007087 A1 | 1/2013 | van den Brink et al. |
| 2013/0008726 A1 | 1/2013 | Eberler et al. |
| 2013/0009640 A1 | 1/2013 | Fautz et al. |
| 2013/0027034 A1 | 1/2013 | Elgort et al. |
| 2013/0038324 A1 | 2/2013 | Wu et al. |
| 2013/0059293 A1 | 3/2013 | Menon et al. |
| 2013/0069648 A1 | 3/2013 | Grodzki |
| 2013/0076356 A1 | 3/2013 | Jellus et al. |
| 2013/0076357 A1 | 3/2013 | Grodzki et al. |
| 2013/0082702 A1 | 4/2013 | Blumhagen et al. |
| 2013/0082703 A1 | 4/2013 | Grodzki |
| 2013/0082704 A1 | 4/2013 | Grodzki |
| 2013/0082707 A1 | 4/2013 | Biber et al. |
| 2013/0082712 A1 | 4/2013 | Stocker |
| 2013/0088223 A1 | 4/2013 | Konno et al. |
| 2013/0088229 A1 | 4/2013 | Van Den Brink |
| 2013/0096825 A1 | 4/2013 | Mohanty |
| 2013/0113482 A1 | 5/2013 | Speier |
| 2013/0119983 A1 | 5/2013 | Zenge |
| 2013/0127463 A1 | 5/2013 | Matschl et al. |
| 2013/0137969 A1 | 5/2013 | Jones |
| 2013/0147475 A1 | 6/2013 | Yang et al. |
| 2013/0154643 A1 | 6/2013 | Kalechofsky |
| 2013/0162254 A1 | 6/2013 | Hierl et al. |
| 2013/0165768 A1 | 6/2013 | Biber |
| 2013/0176140 A1 | 7/2013 | Tyshko |
| 2013/0179083 A1 | 7/2013 | Gruber et al. |
| 2013/0187647 A1 | 7/2013 | Walsh et al. |
| 2013/0200890 A1 | 8/2013 | Hursan |
| 2013/0200891 A1 | 8/2013 | Kruspe et al. |
| 2013/0200896 A1 | 8/2013 | Maciejewski |
| 2013/0201316 A1 | 8/2013 | Binder et al. |
| 2013/0221965 A1 | 8/2013 | Nistler et al. |
| 2013/0234702 A1 | 9/2013 | Blanz |
| 2013/0234704 A1 | 9/2013 | Hurlimann et al. |
| 2013/0234705 A1 | 9/2013 | Mandal et al. |
| 2013/0234706 A1 | 9/2013 | Mandal et al. |
| 2013/0234709 A1 | 9/2013 | Hierl et al. |
| 2013/0234711 A1 | 9/2013 | Dietz et al. |
| 2013/0234712 A1 | 9/2013 | Dietz et al. |
| 2013/0237803 A1 | 9/2013 | Rapoport |
| 2013/0241549 A1 | 9/2013 | Kiruluta |
| 2013/0242430 A1 | 9/2013 | Aoyama et al. |
| 2013/0249550 A1 | 9/2013 | Feiweier et al. |
| 2013/0251227 A1 | 9/2013 | Wang et al. |
| 2013/0253308 A1 | 9/2013 | Kalechofsky |
| 2013/0257428 A1 | 10/2013 | Weinberg |
| 2013/0265050 A1 | 10/2013 | Grodzki et al. |
| 2013/0265055 A1 | 10/2013 | Mitchell et al. |
| 2013/0271136 A1 | 10/2013 | Weinberg et al. |
| 2013/0271142 A1 | 10/2013 | Penanen et al. |
| 2013/0275086 A1 | 10/2013 | Grodzki et al. |
| 2013/0278265 A1 | 10/2013 | Kim et al. |
| 2013/0278283 A1 | 10/2013 | Berkley |
| 2013/0281823 A1 | 10/2013 | Stemmer |
| 2013/0281824 A1 | 10/2013 | Stemmer |
| 2013/0281827 A1 | 10/2013 | Stemmer |
| 2013/0281828 A1 | 10/2013 | Stemmer |
| 2013/0289913 A1 | 10/2013 | Jahns et al. |

(56) References Cited

U.S. PATENT DOCUMENTS

| | | |
|---|---|---|
| 2013/0293230 A1 | 11/2013 | Schneider et al. |
| 2013/0300411 A1 | 11/2013 | Wiggins |
| 2013/0300418 A1 | 11/2013 | Eberler et al. |
| 2014/0000630 A1 | 1/2014 | Ford |
| 2014/0008143 A1 | 1/2014 | Eberler |
| 2014/0009159 A1 | 1/2014 | Vaes et al. |
| 2014/0015528 A1 | 1/2014 | Landschuetz et al. |
| 2014/0028312 A1 | 1/2014 | Popescu |
| 2014/0035579 A1 | 2/2014 | Paul |
| 2014/0049259 A1 | 2/2014 | Poon et al. |
| 2014/0055136 A1 | 2/2014 | Leussler et al. |
| 2014/0062481 A1 | 3/2014 | Greiser et al. |
| 2014/0070810 A1 | 3/2014 | Robert et al. |
| 2014/0073903 A1 | 3/2014 | Weber et al. |
| 2014/0077810 A1 | 3/2014 | Grodzki |
| 2014/0084915 A1 | 3/2014 | Walsh et al. |
| 2014/0084920 A1 | 3/2014 | Marzendorfer et al. |
| 2014/0084923 A1 | 3/2014 | Grodzki et al. |
| 2014/0084924 A1 | 3/2014 | Grodzki |
| 2014/0084927 A1 | 3/2014 | Walsh et al. |
| 2014/0091796 A1 | 4/2014 | Grodzki et al. |
| 2014/0113828 A1 | 4/2014 | Gilbert et al. |
| 2014/0133716 A1 | 5/2014 | Zenge |
| 2014/0155734 A1 | 6/2014 | Schmidt |
| 2014/0161730 A1 | 6/2014 | Sitharaman et al. |
| 2014/0167761 A1 | 6/2014 | Seki et al. |
| 2014/0218028 A1 | 8/2014 | Snyder et al. |
| 2014/0218029 A1 | 8/2014 | Kalechofsky |
| 2014/0218867 A1 | 8/2014 | Kim et al. |
| 2014/0221815 A1 | 8/2014 | Aklan et al. |
| 2014/0225614 A1 | 8/2014 | Prado |
| 2014/0225616 A1 | 8/2014 | Maciejewski et al. |
| 2014/0229705 A1 | 8/2014 | van den Brink et al. |
| 2014/0232391 A1 | 8/2014 | Kadayam Viswanathan et al. |
| 2014/0232400 A1 | 8/2014 | Kim et al. |
| 2014/0235996 A1 | 8/2014 | Kim et al. |
| 2014/0236514 A1 | 8/2014 | Icove et al. |
| 2014/0247094 A1 | 9/2014 | Englund et al. |
| 2014/0249033 A1 | 9/2014 | Orozco et al. |
| 2014/0253111 A1 | 9/2014 | Orozco et al. |
| 2014/0253116 A1 | 9/2014 | Freedman et al. |
| 2014/0266197 A1 | 9/2014 | Kalechofsky |
| 2014/0285190 A1 | 9/2014 | Allen et al. |
| 2014/0285191 A1 | 9/2014 | Kalechofsky |
| 2014/0285192 A1 | 9/2014 | Kalechofsky |
| 2014/0285198 A1 | 9/2014 | Halpern |
| 2014/0296700 A1 | 10/2014 | Gulani et al. |
| 2014/0296702 A1 | 10/2014 | Griswold et al. |
| 2014/0300357 A1 | 10/2014 | Bachschmidt et al. |
| 2014/0300358 A1 | 10/2014 | Rapoport |
| 2014/0320128 A1 | 10/2014 | Paul et al. |
| 2014/0320130 A1 | 10/2014 | Nistler |
| 2014/0322137 A1 | 10/2014 | Flynn |
| 2014/0333303 A1 | 11/2014 | Paul et al. |
| 2014/0343397 A1 | 11/2014 | Kim et al. |
| 2014/0343882 A1 | 11/2014 | Taulu et al. |
| 2014/0354278 A1 | 12/2014 | Subbarao |
| 2014/0361774 A1 | 12/2014 | Jensen |
| 2014/0368203 A1 | 12/2014 | Samson et al. |
| 2014/0375313 A1 | 12/2014 | Salit et al. |
| 2014/0375314 A1 | 12/2014 | Buckner et al. |
| 2014/0378815 A1 | 12/2014 | Huang et al. |
| 2014/0378818 A1 | 12/2014 | Drake et al. |
| 2015/0008917 A1 | 1/2015 | Kentgens et al. |
| 2015/0015257 A1 | 1/2015 | Fautz |
| 2015/0015258 A1 | 1/2015 | Fautz et al. |
| 2015/0022207 A1 | 1/2015 | Meyer et al. |
| 2015/0022208 A1 | 1/2015 | Biber |
| 2015/0025359 A1 | 1/2015 | Fenchel et al. |
| 2015/0025362 A1 | 1/2015 | Biber et al. |
| 2015/0035529 A1 | 2/2015 | Hopper et al. |
| 2015/0035532 A1 | 2/2015 | Kalechofsky |
| 2015/0042334 A1 | 2/2015 | Kannengiesser et al. |
| 2015/0042392 A1 | 2/2015 | Dunnam |
| 2015/0048828 A1 | 2/2015 | Ha et al. |
| 2015/0054503 A1 | 2/2015 | Chen et al. |
| 2015/0054506 A1 | 2/2015 | Eberler et al. |
| 2015/0061664 A1 | 3/2015 | Reiderman et al. |
| 2015/0061665 A1 | 3/2015 | Reiderman et al. |
| 2015/0061670 A1 | 3/2015 | Fordham et al. |
| 2015/0061673 A1 | 3/2015 | Li et al. |
| 2015/0061681 A1 | 3/2015 | Renz et al. |
| 2015/0066413 A1 | 3/2015 | Bhagat et al. |
| 2015/0073264 A1 | 3/2015 | Graziani et al. |
| 2015/0077102 A1 | 3/2015 | Mandal et al. |
| 2015/0077109 A1 | 3/2015 | Grodzki |
| 2015/0077115 A1 | 3/2015 | Fautz et al. |
| 2015/0081225 A1 | 3/2015 | Keady et al. |
| 2015/0084630 A1 | 3/2015 | Rapoport |
| 2015/0084632 A1 | 3/2015 | Wilhelm et al. |
| 2015/0084636 A1 | 3/2015 | Popescu |
| 2015/0087051 A1 | 3/2015 | Rapoport |
| 2015/0087958 A1 | 3/2015 | Kartmann et al. |
| 2015/0091561 A1 | 4/2015 | Dai et al. |
| 2015/0097562 A1 | 4/2015 | Grodzki et al. |
| 2015/0099876 A1 | 4/2015 | Chan et al. |
| 2015/0099963 A1 | 4/2015 | Navarro de Lara et al. |
| 2015/0102810 A1 | 4/2015 | Grodzki et al. |
| 2015/0104371 A1 | 4/2015 | Peters et al. |
| 2015/0108981 A1 | 4/2015 | Grodzki et al. |
| 2015/0112167 A1 | 4/2015 | Conrad et al. |
| 2015/0112168 A1 | 4/2015 | Conrad et al. |
| 2015/0123660 A1 | 5/2015 | Vaughan, Jr. et al. |
| 2015/0128696 A1 | 5/2015 | Foreman et al. |
| 2015/0130465 A1 | 5/2015 | Wiggins et al. |
| 2015/0137815 A1 | 5/2015 | Lakshmanan et al. |
| 2015/0141064 A1 | 5/2015 | Bjorn |
| 2015/0145513 A1 | 5/2015 | Li et al. |
| 2015/0146956 A1 | 5/2015 | Gall et al. |
| 2015/0168524 A1 | 6/2015 | Nittka |
| 2015/0173678 A1 | 6/2015 | Jones |
| 2015/0182417 A1 | 7/2015 | Nagatani |
| 2015/0185298 A1 | 7/2015 | Crozier et al. |
| 2015/0190055 A1 | 7/2015 | Park et al. |
| 2015/0204959 A1 | 7/2015 | Grodzki |
| 2015/0208946 A1 | 7/2015 | Popescu |
| 2015/0212171 A1 | 7/2015 | Hebrank et al. |
| 2015/0219730 A1 | 8/2015 | Tsukamoto et al. |
| 2015/0219732 A1 | 8/2015 | Diamond et al. |
| 2015/0234024 A1 | 8/2015 | Grodzki et al. |
| 2015/0238125 A1 | 8/2015 | Acosta et al. |
| 2015/0238636 A1 | 8/2015 | Homyk et al. |
| 2015/0241541 A1 | 8/2015 | Blanz et al. |
| 2015/0244482 A1 | 8/2015 | Biber |
| 2015/0253398 A1 | 9/2015 | Ferrand et al. |
| 2015/0253405 A1 | 9/2015 | Grodzki et al. |
| 2015/0253408 A1 | 9/2015 | Grodzki et al. |
| 2015/0257700 A1 | 9/2015 | Fu |
| 2015/0260812 A1 | 9/2015 | Drake et al. |
| 2015/0285881 A1 | 10/2015 | Ott |
| 2015/0292316 A1 | 10/2015 | Bulu et al. |
| 2015/0293190 A1 | 10/2015 | Paul et al. |
| 2015/0293201 A1 | 10/2015 | Assmann et al. |
| 2015/0295320 A1 | 10/2015 | Lee et al. |
| 2015/0305636 A1 | 10/2015 | Dawson |
| 2015/0312670 A1 | 10/2015 | Candidus et al. |
| 2015/0315563 A1 | 11/2015 | Orlova et al. |
| 2015/0320342 A1 | 11/2015 | Biber et al. |
| 2015/0323622 A1 | 11/2015 | Wang |
| 2015/0327813 A1 | 11/2015 | Fu |
| 2015/0332164 A1 | 11/2015 | Maassen van den Brink et al. |
| 2015/0335243 A1 | 11/2015 | Assmann |
| 2015/0335285 A1 | 11/2015 | Poon et al. |
| 2015/0338478 A1 | 11/2015 | Schillak et al. |
| 2015/0342496 A1 | 12/2015 | Greiser et al. |
| 2015/0346153 A1 | 12/2015 | Boyd et al. |
| 2015/0355302 A1 | 12/2015 | Fischer et al. |
| 2015/0377987 A1 | 12/2015 | Menon et al. |
| 2015/0377990 A1 | 12/2015 | Driemel et al. |
| 2015/0380158 A1 | 12/2015 | Brady et al. |
| 2016/0011284 A1 | 1/2016 | Popescu |
| 2016/0011290 A1 | 1/2016 | Iannello |
| 2016/0012011 A1 | 1/2016 | Llinas et al. |
| 2016/0015352 A1 | 1/2016 | Brown et al. |

(56) References Cited

U.S. PATENT DOCUMENTS

| | | |
|---|---|---|
| 2016/0018267 A1 | 1/2016 | Timofeev et al. |
| 2016/0018479 A1 | 1/2016 | Cambou et al. |
| 2016/0018480 A1 | 1/2016 | Cambou et al. |
| 2016/0018481 A1 | 1/2016 | Cambou et al. |
| 2016/0018482 A1 | 1/2016 | Yehoshua et al. |
| 2016/0018483 A1 | 1/2016 | Oren-Pines et al. |
| 2016/0018491 A1 | 1/2016 | Driscoll et al. |
| 2016/0018492 A1 | 1/2016 | Driscoll et al. |
| 2016/0018493 A1 | 1/2016 | Reiderman |
| 2016/0018494 A1 | 1/2016 | Driscoll et al. |
| 2016/0018495 A1 | 1/2016 | Driscoll et al. |
| 2016/0018555 A1 | 1/2016 | Jachmann et al. |
| 2016/0021219 A1 | 1/2016 | Brown et al. |
| 2016/0022142 A1 | 1/2016 | Bradshaw |
| 2016/0022146 A1 | 1/2016 | Piron et al. |
| 2016/0025821 A1 | 1/2016 | Widmer et al. |
| 2016/0025825 A1 | 1/2016 | Taicher |
| 2016/0025826 A1 | 1/2016 | Taicher |
| 2016/0025827 A1 | 1/2016 | Taicher |
| 2016/0027342 A1 | 1/2016 | Ben-Haim |
| 2016/0029998 A1 | 2/2016 | Brister et al. |
| 2016/0033671 A1 | 2/2016 | Chen |
| 2016/0038049 A1 | 2/2016 | Geva |
| 2016/0054412 A1 | 2/2016 | Ganssle et al. |
| 2016/0058322 A1 | 3/2016 | Brister et al. |
| 2016/0061911 A1 | 3/2016 | Lippitz et al. |
| 2016/0061921 A1 | 3/2016 | Katscher et al. |
| 2016/0061986 A1 | 3/2016 | Anand et al. |
| 2016/0069973 A1 | 3/2016 | Fenchel et al. |
| 2016/0076924 A1 | 3/2016 | Pusiol et al. |
| 2016/0077026 A1 | 3/2016 | Pusiol et al. |
| 2016/0077167 A1 | 3/2016 | Heidmann |
| 2016/0077182 A1 | 3/2016 | Wang et al. |
| 2016/0077183 A1 | 3/2016 | Jachmann et al. |
| 2016/0084929 A1 | 3/2016 | Dale et al. |
| 2016/0084971 A1 | 3/2016 | Cates, Jr. et al. |
| 2016/0089055 A1 | 3/2016 | Rapoport |
| 2016/0093420 A1 | 3/2016 | Urzhumov |
| 2016/0111192 A1 | 4/2016 | Suzara |
| 2016/0116554 A1 | 4/2016 | Sakellariou et al. |
| 2016/0116558 A1 | 4/2016 | Grodzki et al. |
| 2016/0123971 A1 | 5/2016 | Taicher |
| 2016/0124058 A1 | 5/2016 | Rapoport |
| 2016/0124059 A1 | 5/2016 | Notaros et al. |
| 2016/0124061 A1 | 5/2016 | Grodzki |
| 2016/0124062 A1 | 5/2016 | Taicher |
| 2016/0124109 A1 | 5/2016 | Yarman et al. |
| 2016/0129131 A1 | 5/2016 | Vitari et al. |
| 2016/0131728 A1 | 5/2016 | Biber et al. |
| 2016/0136308 A1 | 5/2016 | Flynn |
| 2016/0139227 A1 | 5/2016 | Grodzki et al. |
| 2016/0146908 A1 | 5/2016 | Kohler et al. |
| 2016/0146913 A1 | 5/2016 | Renz et al. |
| 2016/0157742 A1 | 6/2016 | Huang et al. |
| 2016/0157828 A1 | 6/2016 | Sumi et al. |
| 2016/0158155 A1 | 6/2016 | Murakami et al. |
| 2016/0161429 A1 | 6/2016 | Englund et al. |
| 2016/0161578 A1 | 6/2016 | Weissler et al. |
| 2016/0161582 A1 | 6/2016 | Neji et al. |
| 2016/0170070 A1 | 6/2016 | Jachmann et al. |
| 2016/0209484 A1 | 7/2016 | Bauer et al. |
| 2016/0216341 A1 | 7/2016 | Boesch et al. |
| 2016/0216343 A1 | 7/2016 | Driemel |
| 2016/0222283 A1 | 8/2016 | Cannan et al. |
| 2016/0238679 A1 | 8/2016 | Zhurbenko |
| 2016/0245882 A1 | 8/2016 | Popescu |
| 2016/0259021 A1 | 9/2016 | Hoelscher et al. |
| 2016/0259022 A1 | 9/2016 | Beck |
| 2016/0259024 A1 | 9/2016 | Bachschmidt et al. |
| 2016/0266272 A1 | 9/2016 | Jachmann et al. |
| 2016/0274202 A1 | 9/2016 | Stemmer |
| 2016/0274205 A1 | 9/2016 | Stemmer |
| 2016/0282427 A1 | 9/2016 | Heidmann |
| 2016/0282433 A1 | 9/2016 | Kannengiesser et al. |
| 2016/0291191 A1 | 10/2016 | Fukushima et al. |
| 2016/0292854 A1 | 10/2016 | Beck |
| 2016/0305239 A1 | 10/2016 | Hopper et al. |
| 2016/0307301 A1 | 10/2016 | Zhou et al. |
| 2016/0313430 A1 | 10/2016 | Nickel |
| 2016/0320519 A1 | 11/2016 | Blanz et al. |
| 2016/0324438 A1 | 11/2016 | Halpern et al. |
| 2016/0327624 A1 | 11/2016 | O'Brien et al. |
| 2016/0334346 A1 | 11/2016 | Cao Minh et al. |
| 2016/0334476 A1 | 11/2016 | Doty |
| 2016/0341710 A1 | 11/2016 | Jensen |
| 2016/0349343 A1 | 12/2016 | Zeller |
| 2016/0356863 A1 | 12/2016 | Boesch et al. |
| 2016/0363641 A1 | 12/2016 | Finnerty et al. |
| 2016/0367167 A1 | 12/2016 | Candidus et al. |
| 2016/0380487 A1 | 12/2016 | Widmer et al. |
| 2016/0380488 A1 | 12/2016 | Widmer et al. |
| 2017/0003413 A1 | 1/2017 | Jachmann et al. |
| 2017/0005523 A1 | 1/2017 | Widmer et al. |
| 2017/0010378 A1 | 1/2017 | Reiderman et al. |
| 2017/0011255 A1 | 1/2017 | Kaditz et al. |
| 2017/0020419 A1 | 1/2017 | Acosta et al. |
| 2017/0040945 A1 | 2/2017 | Kan et al. |
| 2017/0074960 A1 | 3/2017 | Bhat et al. |
| 2017/0082705 A1 | 3/2017 | Hou et al. |
| 2017/0082711 A1 | 3/2017 | Kalechofsky |
| 2017/0123098 A1 | 5/2017 | Wang et al. |
| 2017/0141729 A1 | 5/2017 | Kan et al. |
| 2017/0146615 A1 | 5/2017 | Wolf et al. |
| 2017/0146624 A1 | 5/2017 | Paul et al. |
| 2017/0160214 A1 | 6/2017 | Jensen |
| 2017/0168125 A1 | 6/2017 | Weinberg et al. |
| 2017/0176548 A1 | 6/2017 | Wu et al. |
| 2017/0184755 A1 | 6/2017 | Coman |
| 2017/0196492 A1 | 7/2017 | Conrad et al. |
| 2017/0205487 A1 | 7/2017 | Zeller |
| 2017/0212105 A1 | 7/2017 | Homyk et al. |
| 2017/0212199 A1 | 7/2017 | Itriago Leon et al. |
| 2017/0218748 A1 | 8/2017 | Ganssle et al. |
| 2017/0219670 A1 | 8/2017 | Geppert et al. |
| 2017/0234943 A1 | 8/2017 | Thielens et al. |
| 2017/0254919 A1 | 9/2017 | Coman et al. |
| 2017/0285122 A1 | 10/2017 | Kaditz et al. |
| 2017/0285123 A1 | 10/2017 | Kaditz et al. |
| 2017/0285214 A1 | 10/2017 | Kischkat et al. |
| 2017/0299670 A1 | 10/2017 | Tramm et al. |
| 2017/0307701 A1 | 10/2017 | Leussler et al. |
| 2017/0315200 A1 | 11/2017 | Kiefer et al. |
| 2017/0315204 A1 | 11/2017 | Schneider et al. |
| 2017/0316795 A1 | 11/2017 | Heidmann |
| 2017/0322272 A1 | 11/2017 | Kalechofsky |
| 2017/0325710 A1 | 11/2017 | Ryan et al. |
| 2017/0343695 A1 | 11/2017 | Stetson et al. |
| 2017/0370979 A1 | 12/2017 | Braje et al. |
| 2018/0003787 A1 | 1/2018 | Cloos et al. |
| 2018/0003852 A1 | 1/2018 | Jachmann et al. |
| 2018/0017645 A1 | 1/2018 | Weinberg |
| 2018/0017646 A1 | 1/2018 | Feiweier et al. |
| 2018/0017700 A1 | 1/2018 | Shin et al. |
| 2018/0038922 A1 | 2/2018 | Lu et al. |
| 2018/0038926 A1 | 2/2018 | Goodman et al. |
| 2018/0074221 A1 | 3/2018 | Reiderman et al. |
| 2018/0081005 A1 | 3/2018 | Yang et al. |
| 2018/0081008 A1 | 3/2018 | Yang et al. |
| 2018/0116519 A1 | 5/2018 | Piron et al. |
| 2018/0120471 A1 | 5/2018 | Chen et al. |
| 2018/0136291 A1 | 5/2018 | Pham et al. |
| 2018/0140218 A1 | 5/2018 | Heberlein et al. |
| 2018/0149765 A1 | 5/2018 | Hurlimann et al. |
| 2018/0184973 A1 | 7/2018 | Nayak |
| 2018/0196111 A1 | 7/2018 | Boesch et al. |
| 2018/0196163 A1 | 7/2018 | Desmond |
| 2018/0202952 A1 | 7/2018 | Lutz et al. |
| 2018/0203080 A1 | 7/2018 | Acosta et al. |
| 2018/0217214 A1 | 8/2018 | Li et al. |
| 2018/0228917 A1 | 8/2018 | Vitari et al. |

(56) References Cited

U.S. PATENT DOCUMENTS

2018/0238985 A1 8/2018 Grodzki
2018/0246178 A1 8/2018 Wang et al.

OTHER PUBLICATIONS

K K. Likharev and V. K. Semenov, "RSFQ Logic/Memory Family: A New Josephson-Junction Technology for Sub-Terahertz-Clock-Frequency Digital Systems", IEEE Transactions on Applied Superconductivity, vol. 1, No. 1, Mar. 1991 (pp. 3-28).
L. Darasse and J.C. Ginefri, "Perspectives with cryogenic RF probes in biomedical MRI", Biochimie, vol. 85, p. 915 (2003).
"Calculated SNR of MRI detected with SQUIDs and Faraday detectors", W. Myers, et al., Journal of Magnetic Resonance, vol. 186, p. 182 (2007).
Comparison of linear and circular polarization for magnetic resonance imaging G. H. Glover, C. E. Hayesa N. J. Pelc, W. A. Edelstein, O. M. Mueller, H. R. Hart, C. J. Hardy, M. O'Donnell and W. D. Barber, http://www.sciencedirect.com/science/article/pii/002223648590349X, Journal of Magnetic Resonance (1969), vol. 64, Issue 2, Sep. 1985, pp. 255-270.
Ultimate intrinsic signal-to-noise ratio in MRI, Ogan Ocali, Ergin Atalar, Magnetic Resonance in Medicine, vol. 39, Issue 3, pp. 462-473, Mar. 1998.
G. Kaiser, S. Linzen, H. Schneidewind, U. Hubner and P. Seidel, "First experimental investigations on a thin film Hall magnetometer with a high temperature superconducting pick-up antenna", Cryogenics 38 (1998) 625-629.

\* cited by examiner

```
%Matlab program QuadMRI
t=0:99;%Time units
t1=2*pi*t/100;%Dimensionless time in radians
NoiseAmp=10;%Noise to signal ratio
Angle=pi/180*(60);%Noise vector angle in radians
Phi=pi/180*(40);%Signal phase shift in radians
Sig=cos(t1+Phi);%Signal in x-coil
SigQuad=sin(t1+Phi);%Signal in y-coil
NoiseSig=NoiseAmp*cos(t1);%Noise signal
Vx=cos(Angle)*NoiseSig+Sig;%X-coil signal+noise
Vy=sin(Angle)*NoiseSig+SigQuad;%Y-coil signal+noise
Root=sqrt(Vx.^2+Vy.^2);cosEst=abs(Vx)./Root;%First estimate of cos(Angle)
sinEst=abs(Vy)./Root;%First estimate of sin(Angle)
tanEst=Vy./Vx;%First estimate of tan(Angle)
tanAv=sum(tanEst)/100;%Average of tan(Angle)
cosAv=sum(cosEst)/100;%Average of cos(Angle)
sinAv=sum(sinEst)/100;%Average of sin(Angle)
sinAv=sinAv*sign(tanAv);%Sign correction for negative angles
thetaEst=acos(cosEst);%First estimate of Angle in radians
thetaAv=sum(thetaEst)/100*sign(tanAv);%Average of Angle in radians
SigEst=cosAv*Vy-sinAv*Vx;%Recovered signal
SigShift=sin(t1+Phi-Angle);%Ideal signal for comparison with recovered signal
plot(t,SigEst,t, SigShift,t, Vy);%Plot comparing the large noisy signal with recovered and ideal signals
```

Fig. 5

SYSTEM AND METHOD FOR NOISE REDUCTION IN MAGNETIC RESONANCE IMAGING

CROSS REFERENCE TO RELATED APPLICATIONS

The present application is a Continuation of U.S. patent application Ser. No. 13/086,793, filed Apr. 14, 2011, now U.S. Pat. No. 8,970,217, issued Mar. 3, 2015, which claims benefit of priority from U.S. Patent Application No. 61/324,130, filed Apr. 14, 2010, the entirety of which are expressly incorporated here by reference.

BACKGROUND OF THE INVENTION

Nuclear magnetic resonance (NMR) is associated with coherent resonant rotation of magnetic atomic nuclei, around an axis parallel to a large static applied magnetic field, following excitation by a radio-frequency pulse. The rotation frequency (the Larmor frequency) is proportional to the applied magnetic field, given by $f=\gamma B$, where $\gamma=42$ MHz/T for the hydrogen nucleus (proton) and of similar magnitude for other nuclei. The coherent decay time, known as $T_2$, is typically of order 100 ms, reflecting the very high-Q nuclear rotations with only weak interactions with the atomic environments. In magnetic resonance imaging (MRI), appropriate weak gradients in applied magnetic field are used to obtain frequency gradients, thus enabling Fourier transforms of the nuclear signal to be mapped onto spatial images. However, the coherent signal is extremely weak, corresponding to radio frequency (RF) magnetic fields (for 1-mm resolution) of order $10^{-14}$ T (=10 fT) in an applied field of order 1 T. For an applied field in the z-direction, the RF magnetic signal rotates in the x-y plane at the Larmor frequency, corresponding to circular polarization (see FIG. 1).

Magnetic resonance imaging (MRI) is primarily a medical imaging technique commonly used in radiology to visualize detailed internal structures and limited functions of the body, but also used in non-destructive testing and other fields. MRI is useful because it provides great contrast between the different soft tissues of the body, such as lipid and aqueous. MRI is discussed in detail at en.wikipedia.org/wiki/Magnetic_resonance_imaging (incorporated herein by reference).

In addition to the desired RF signal, the measured RF fields also comprise noise within the same frequency band. There may be many sources of noise, including noise associated with electrical currents in the antenna and amplifiers in the receiver. The dominant source of noise in MRI systems typically comprises fluctuating Johnson noise associated with thermally excited eddy currents in the electrically conducting medium of the human body or other object under examination. Johnson noise is the electrical noise generated by the thermal agitation of charge carriers, such as electrons and ions, inside an electrical conductor at equilibrium. Johnson noise is approximately white, meaning that its spectral density is nearly equal throughout the frequency spectrum, and therefore including even the relatively narrow bands of interest during MRI signal processing. See, for example, "Signal-to-noise ratio in MRI", T. W. Redpath, British Journal of Radiology, vol. 71, pp. 704-707 (1998), incorporated herein by reference. This Johnson noise is largely independent of the static magnetic field, while the signal of interest is proportional to the applied field. (This is the main impetus for the use of very large magnetic fields.) These eddy currents create broadband RF magnetic fields which also couple to the pickup coil or coils, with a form within a narrow band of interest that may be expressed as $B_n(t)=B_{n0} \cos(\omega t+\phi_n)$, where $B_{n0}$ and $\phi_n$ are the amplitude and phase of the fluctuating noise component of the magnetic field that couples to the coil. MRI receivers generally filter out all noise outside of the narrow band required for the MRI signal. For example, a typical receiver bandwidth might be 50 kHz or less. In this case, $B_{n0}$ and $\phi_n$ can vary significantly over a time greater than about 20 microseconds limited by the receiver bandwidth. Note that the nuclear signal itself is coherent for a time $T_2$ of order 100 ms, while the various noise sources are incoherent (or coherent over much shorter timescales), so that signal integration generally increases the signal amplitude linearly with the time, while it increases the noise amplitude with the square root of the time. The signal-to-noise ratio (SNR) thus increases with averaging or measurement repetition. However, performing an integration over the coherence time to maximize the signal to noise ratio may unduly prolong an MRI scan, which is uncomfortable to the patient, and may lead to movement artifacts during the scan.

There has been relatively little effort in the prior art devoted to measuring and characterizing the body noise in MRI. However, U.S. Pat. No. 6,865,494, expressly incorporated herein by reference, proposes to provide "noise tomography", in which a three dimensional scan of Johnson noise is itself the output, wherein tissues having different conductivity have variations in the measured noise.

One type of MRI antenna is described in by Eydelman in U.S. Pat. No. 6,636,040, incorporated herein by reference. Eydelman's antenna, and that of similar devices, reads both the signal, as well as noise from Eddy Currents caused by various dynamic magnetic fields in the body, including those induced by the MRI machine itself. The isolation of the signal with respect to in-band noise is difficult and often impossible, leading to impaired resolution or aberrations, longer scan time, and/or image noise.

Consider a planar pickup coil in the y-z plane, which detects a field component of the rotating nuclear magnetic signal $B_{sx}(t)=B_{s0} \cos(\omega t)$ in the x-direction, where $w=2\pi f$ is the Larmor frequency. An identical coil oriented in the x-z plane will detect the corresponding nuclear magnetic field component $B_{sy}(t)=B_{s0} \sin(\omega t)$ in the y-direction, shifted by 90° from the first coil. Taken together, the two coils form a quadrature antenna, which is known in the prior art. The prior art further teaches that applying a 90° phase shift and adding the signals from the two antennas will increase the nuclear magnetic signal amplitude by a factor of two. See, for example, U.S. Pat. Nos. 7,649,353; 4,769,605; 5,351,688.

If one has two antennas in a quadrature configuration, adding the two signals with a 90° phase shift increases the signal amplitude by a factor of two, as noted above. If the noise signals $B_n$ from the two antennas are uncorrelated, then adding the two signals increases the noise amplitude by a factor of the square root of two ($\sqrt{2}$). So the SNR would increase by $\sqrt{2}$, or about 3 dB in terms of power ratios. Such an improvement is significant but limited.

A further aspect of the prior art is the development of more sensitive low-noise receivers, including cryogenic coils, superconducting sensors (based on superconducting quantum interference devices or SQUIDs), and low-noise amplifiers. These may be useful when the signal of interest is especially weak, as for example in relatively low magnetic fields. See, for example, U.S. patent application Ser. No. 12/954,291, filed Nov. 24, 2010, expressly incorporated herein by reference in its entirety. See also, for example, U.S. Pat. Nos. 6,885,192; 7,053,610; 6,538,445; 5,276,398; see also L. Darasse and J. C. Ginefri, "Perspectives with cryogenic RF probes in biomedical MRI", Biochimie, vol. 85, p. 915 (2003) and "Calculated SNR of MRI detected with SQUIDs and Faraday detectors", W. Myers, et al., Journal of Magnetic Resonance, vol. 186, p. 182 (2007), incorporated herein by reference. However, in many cases the receiver noise is already less than the body noise, so that very little additional SNR is obtained from further reduction in receiver noise.

Superconducting quantum interference devices (SQUIDs) are very sensitive magnetometers used to measure extremely weak magnetic fields, such as those produced during MRI medical tests, based on superconducting loops containing Josephson junctions.

See, U.S. Pat. Nos. 7,688,069, 7,671,587, 7,603,158, 7,573,268, 7,573,264, 7,560,289, 7,535,228, 7,525,314, 5,586,064, 3,801,877, 7,521,928, 7,482,807, 7,474,095, 7,466,132, 7,395,107, 7,363,070, 7,248,044, 7,218,104, 7,197,352, 7,193,415, 7,187,169, 7,144,376, 7,130,675, 7,123,952, 7,092,748, 7,038,450, 6,897,654, 6,865,494, 6,697,660, 6,681,131, 6,544,170, 6,522,908, 6,477,398, 6,374,131, 6,370,414, 6,208,884, 6,187,032, 6,159,444, 6,150,809, 6,073,040, 6,031,373, 6,002,254, 5,982,174, 5,827,501, 5,771,894, 5,771,893, 5,755,227, 5,752,514, 5,682,889, 5,671,740, 5,657,756, 5,608,320, 5,601,081, 5,600,243, 5,594,849, 5,543,770, 5,495,849, 5,442,290, 5,426,365, 5,408,178, 5,384,109, 5,351,006, 5,339,811, 5,326,986, 5,325,854, 5,303,705, 5,274,331, 5,233,992, 5,208,534, 5,187,327, 5,057,776, 5,021,739, 4,951,674, 7,116,102, 7,053,610, 6,885,192, 6,724,188, 4,390,840, 4,442,404, 4,573,015, 4,588,947, 4,851,777, 4,864,237, 4,906,931, 4,987,368, 5,057,776, 5,208,533, 5,254,950, 5,300,887, 5,343,147, 5,557,199, 5,600,243, 5,835,995, 6,023,161, 6,031,373, 6,159,444, 6,544,170, 6,724,188, 4,879,516, 4,695,801, 7,126,333, 6,838,875, 5,436,564 and 2006/0186882, each of which is expressly incorporated herein by reference.

The prior art has not effectively solved the issue of noise in bioelectric and/or biomagnetic field measurements, such as the background body noise in MRI systems, so that one may obtain high-resolution images with ultra-sensitive receivers, without requiring the largest magnetic fields and long integration times.

SUMMARY OF THE INVENTION

The invention takes advantage of the observation that the body noise (or sample noise) in MRI has a substantially different physical profile than the nuclear signal of interest, and active real-time interference cancelation may thus be applied to reduce the effect of the noise. While the body noise is incoherent and changes quickly, if a real-time measurement of the body noise can be subtracted from the total signal, the signal of interest can be measured more accurately. The relevant distinctive physical properties of the body noise may be examined by considering an element of a transient electric current dipole that is believed to comprise much of the body noise. Such a current dipole is characterized by the following properties:

1) The electromagnetic field from such a current dipole is always linearly polarized, in contrast to the circularly polarized MRI signal of interest.
2) A short-pulse current dipole with pulse-width $\Delta t$ (~1 ns) corresponds to a power spectrum that is flat up to a cutoff frequency ~$1/\Delta t$, i.e., broadband white noise. This is quite different from the narrowband 100-ms coherent MRI signal of interest.
3) Such a current dipole may also be spatially localized differently from the MRI signal.

While a real system of interest may exhibit a large number of interfering noise signals from such current dipole sources at various positions, times, and directions, the principle of body noise cancelation may be illustrated by consideration of a single current dipole source at a time.

One embodiment of the invention focuses on the signal polarization, and provides an enhancement of a quadrature antenna configuration according to the prior art, but rather than simply combining the two signals with a 90° phase delay, it makes use of more sophisticated digital processing to combine the two signals in a way that substantially cancels the background noise. The fact that this may be possible has not been recognized in the prior art. This, for example, enables an enhancement of SNR by much more than the 3 dB predicted in the prior art. Other embodiments provide more complex antennas (e.g., with broader bandwidth) and antenna arrays, for example.

For simplicity, we assume that there is a single dominant noise source, corresponding to a linearly polarized magnetic field vector $B_n$, pointing in a direction $\theta$ relative to the x-axis, as shown in FIG. 1. (In general there would also be a component of $B_n$ pointing in the z-direction, but that is not detected by either coil, so it is ignored here.) In order to cancel the noise, it is important to determine this direction angle $\theta$, and track it as it changes in time.

The detected field components in the two coils in the x- and y-directions are:

$$B_x(t)=B_{sx}(t)+B_{nx}(t)=B_{s0}\cos(\omega t+\phi_s)+B_{n0}\cos(\theta)\cos(\omega t+\phi_n) \qquad (1)$$

$$B_y(t)=B_{sy}(t)+B_{ny}(t)=B_{s0}\sin(\omega t+\phi_s)+B_{n0}\sin(\theta)\cos(\omega t+\phi_n) \qquad (2)$$

where $\phi_s$ the phase shift of $B_s$, and $\phi_n$ is the phase shift of $B_n$. It is further assumed that while $B_s$, $\phi_s$, $B_n$, $\theta$, and $\phi_n$ may be functions of time within the bandwidth of the signal, they can be regarded as constants for short times of an RF period.

The useful information content for reconstructing the MRI image is contained within $B_{s0}$ and $\phi_s$. There are two equations with five unknowns for each value of t, but given multiple times, the system is fully determined. There may be many ways to solve for $B_{s0}$ and $\phi_s$.

In a preferred embodiment of the method, if we can estimate the angle $\theta$ (described further below), then we can cancel out the noise by multiplying the first signal by $\sin(\theta)$ and the second signal by $\cos(\theta)$, and taking the difference. Then we have:

$$B_y(t)\cos(\theta)-B_x(t)\sin(\theta)=B_{s0}[\sin(\omega t+\phi_s)\cos(\theta)-\cos(\omega t+\phi_s)\sin(\theta)]=B_{s0}\sin(\omega t+\phi_s-\theta) \qquad (3)$$

Since we know $\theta$, we can then time-shift the result to obtain:

$$B_{sy}(t)=B_{s0}\sin(\omega t+\phi_s)=B_y(t+\theta/\omega)\cos(\theta)-B_x(t+\theta/\omega)\sin(\theta). \qquad (4)$$

This permits cancellation of the noise, even if $B_{s0} \ll B_{n0}$. In fact, this is a preferred regime to focus on, since otherwise this algorithm has less applicability. In that limit, one can obtain a first crude estimate $\theta_{est}$ by neglecting $B_s$ in Eqs. (1) and (2):

$$\theta_{est}=\tan^{-1}(B_y/B_x) \qquad (5)$$

Let us assume that θ lies in the range from $-\pi/2$ to $+\pi/2$. Then we have $$\cos(\theta_{est}) = |B_x|/\sqrt{(B_x^2 + B_y^2)}, \quad (6)$$

$$\sin(\theta_{est}) = \tan(\theta_{est})\cos(\theta_{est}) = \text{sign}(B_x) \times B_y/\sqrt{(B_x^2 + B_y^2)}, \quad (7)$$

where $\text{sign}(B_x)$ provides the sign (positive or negative) of the field.

However, this estimate of θ is too crude; substituting these into Eqs. (3) yields the identity $B_{s0} = 0$, thus cancelling out not only the noise but also the signal of interest.

Since θ is a constant over the timescales here, one can obtain a better estimate by taking an appropriate time-average $<\ldots>$. In order to obtain a reasonable diversity of input for the average, it is preferable to include a range of times covering a major fraction of a period. Taking the average of Eq. (5), one has:

$$\theta_{av} = <\tan^{-1}(B_y/B_x)>. \quad (8)$$

Substituting Eqs. (8) into Eq. (4) leads to $$B_{sy}^{est}(t) = B_{s0}^{est} \sin(\omega t + \phi_s^{est}) = B_y(t + \theta_{est}/\omega)\cos(\theta_{av}) - B_x(t + \theta_{est}/\omega)\sin(\theta_{av}) \quad (9)$$

Alternatively, one may average $\cos(\theta_{est})$ and $\sin(\theta_{est})$ separately. Since these are nonlinear functions, the results may be slightly different.

This averaging does indeed lead to an improved estimate of the signal of interest, with most of the noise removed, even for the noise much larger than the signal, as shown in simulations described below.

For longer time-scales (approaching the coherence time $T_2$), one can use this algorithm to track θ(t), so that $B_s(t)$ and $\phi_s(t)$ may be extracted, and the imaging signals obtained from the Fourier transform.

A block diagram of a system employing the proposed polarized noise cancellation method is shown in FIG. 2. Here the angle θ(t) for a time-block of data is calculated digitally in a Digital Angle Calculator module, while the data in the two channels are stored or buffered in a Digital Time Delay module until Eq. (9) may be applied in the Digital Polarized Noise Canceller.

While this simple analysis has focused on instantaneous samples of the RF measurement signals $B_x$ and $B_y$, it is shown below that a similar algorithm may be applied to a downconverted intermediate frequency (IF) signal at a much lower frequency $f_I$. The only requirement is that $f_I >> BW$, the noise-limiting bandwidth of the receiver, so that θ should still be essentially constant over the range of times needed for the average.

In a preferred embodiment of the invention, various corresponding algorithms may be applied to digital samples of the RF or IF signal, using a fast digital processor such as a microprocessor, a dedicated digital signal processing (DSP) chip, or a field-programmable gate array (FPGA). The averages may be applied to sequential blocks of data, or to moving averages; in either case, appropriate memory buffers may be employed.

While the analysis above describes a noise signal that is linearly polarized, the same algorithm may also be applied if the noise signal has a more general elliptical polarization. The algorithm will tend to cancel out the primary axis of the noise, while leaving a reduced circularly polarized component that is more difficult to separate.

Likewise, in some cases, the "noise" itself may be useful, since its characteristics will vary spatially in dependence on characteristics of the medium and relationship of the antenna. The present algorithm can be used to separate this signal from other signals having different polarization characteristics.

In an alternative preferred embodiment of the invention, the receiver measures the RF signal over a much wider frequency band than that normally required for the MRI signal of interest (less than 100 kHz). For example, the RF signal may be highly oversampled with respect to the MRI signal of interest, with the large bandwidth preserved through the signal processing chain. This will, of course, increase the total noise entering the receiver, which is contrary to the conventional approach. However, let us assume the broadband body noise comprises a time-series of narrow pulses, caused by fast current dipoles, as shown in FIG. 3A. (These broadband noise pulses are quite distinct from the narrowband MRI excitation pulses.) Then these pulses can be detected and rejected from the signal using digital processing as shown schematically in FIG. 4, enabling the weaker narrow-band signal of interest to be measured more accurately. This can be accomplished, for example, by using a single pickup coil, which does not filter or and broaden the pulses.

These noise pulses may not all have the same amplitude, or polarity, or spectral characteristics, or emanate from the same location, and may even overlap to some degree, Practically, fast real-time processing may enable these to be identified and subtracted without requiring inordinate amounts of storage. Further pulse discrimination may be obtained using a plurality of pickup coils in different locations, each with its own digital receiver. Since the current dipoles may be localized, the relative pulse-heights may permit further correlation, enabling further noise cancelation.

This narrow pulse discrimination approach requires the use of a very broad-band, low-noise, fast receiver. Such a receiver may comprise digital superconducting components, such as a fast oversampled analog-to-digital converter based on rapid-single-flux-quantum (RSFQ) circuits. See, U.S. Pat. Nos. 7,365,663; 7,728,748; 6,608,581; 7,598,897; 5,140,324; 5,170,080; 5,198,815; 5,289,400, expressly incorporated herein by reference. See, also, K K. Likharev and V. K. Semenov, "RSFQ Logic/Memory Family: A New Josephson-Junction Technology For Sub-Terahertz-Clock-Frequency Digital Systems", IEEE Transactions on Applied Superconductivity, vol. 1, No. 1, March 1991 (pp. 3-28). Preferred analog to digital converters have a sampling rate of at least 10 gigasamples per second for narrow pulse discrimination (body noise), high linearity, and high dynamic range.

The pulse discrimination noise reduction approach is complementary to the polarization noise reduction approach described above. In some cases, it may be appropriate to first apply the pulse discrimination approach to a broad-band signal, followed by a narrow-band filter, and subsequent application of the polarization algorithm.

It is therefore an object to provide a magnetic resonance imaging system, comprising: at least one receive antenna, oriented to sense a radio frequency field; said radio frequency field comprising a phase coherent narrowband oscillating signal of interest and a broadband interfering signal having at least one component within the narrow band of the signal of interest;

a digital processor, configured to reduce an interference of the interfering signal with the signal of interest based on at least a time-correlated model of the interfering signal; and an output, configured to present the reduced interference signal of interest to an image processing unit.

The at least one antenna may comprise a plurality of antennas configured to determine a spatial characteristic of radio frequency fields, the digital processor being configured to at least partially distinguish between the signal of interest and the interfering signal based on different respective spatial characteristics. The at least one antenna may comprise a plurality of antenna elements configured in a two dimensional array, each element of the array having a different respective spatial sensitivity.

The interfering signal may comprise at least one pulse, and wherein the digital processor is configured to process a set of digital data representing the sensed radio frequency field in a time domain.

The digital processor may be configured to process a set of digital data representing the sensed radio frequency field in a frequency domain. The digital processor may be configured to correlate components of the interfering broadband signal within the narrow band with components of the broadband signal outside of the narrow band. The digital processor may be configured to process sequential time samples representing the radio frequency field, to estimate a waveform of the interfering signal, and to selectively digitally remove the estimated waveform of the interfering signal to produce the reduced interference signal.

According to one embodiment, the at least one antenna comprises at least two of the antennas which are oriented to sense a radio frequency field with different electromagnetic vector components; and the digital processor is configured to accept a time series representing a radio frequency field sensed by the at least two antennas, and to generate a digital output signal that increases a ratio of the signal of interest and noise comprising the interfering signal; further comprising an output processor configured to receive the output and to generate a spatial map corresponding to the output reduced interference signal.

The signal of interest may be substantially circularly polarized, and the interfering signal may be substantially linearly polarized. The at least one antenna may, in turn, comprise at least two antenna elements configured to have a differential response pattern to circularly polarized and linearly polarized radio frequency fields within the narrow band.

The at least one antenna may comprise at least two antennas configured to generate at least two quadrature-related magnetic resonance signals.

The digital processor may operate to reduce an interference of the interfering signal with the signal of interest within the narrowband by greater than about 3 dB. The digital processor may be configured to perform a nonlinear transformation on a representation of the radio frequency field. The digital processor may comprise a real-time pipelined processor.

The system may further comprise an analog-to-digital converter configured to directly oversample a signal representing the radio frequency field substantially without frequency translation. The analog-to-digital converter may sample at a multi-GHz rate, and thus produce digital outputs at a multi-gigasample per second rate. The system may further comprise an analog-to-digital converter configured to process a signal representing the radio frequency field after frequency translation.

Another object provides a magnetic resonance imaging method, comprising: sensing a radio frequency field with at least one antenna, the radio frequency field comprising a phase coherent narrowband oscillating signal of interest and a broadband interfering signal having at least one component within the narrow band of the signal of interest; digitally processing a signal representing the radio frequency field to selectively to reduce an interference of the interfering signal with the signal of interest, based on at least a time-correlated model of the interfering signal to produce a reduced interference signal; and outputting the reduced interference signal.

The signal of interest may be predominantly circularly polarized, and the interfering signal may comprise at least one linearly polarized component, the method further comprising:

receiving at least two signals representing a respective vector sum of the signal of interest and the interfering signal, projected in at least two directions; and analyzing the at least two received signals, to separate out the signal of interest from the interfering signal based on a spatial difference therebetween.

The at least one antenna may comprise a plurality of antenna elements configured in a two dimensional array, each element of the array having a different respective spatial sensitivity.

The at least one receive antenna may comprise at least two of the antennas which are oriented to sense a radio frequency field with different electromagnetic vector components; and the digitally processing may comprise processing a time series representing a radio frequency field sensed by the at least two antennas, and generating a digital output signal that increases a ratio of the signal of interest and noise comprising the interfering signal; the method further comprising generating a spatial map corresponding to the reduced interference signal.

The interfering signal may comprise at least one pulse, and wherein the digitally processing comprises processing a set of digital data representing the sensed radio frequency field in a time domain.

The digitally processing may comprise processing at a rate in excess of 2.5 gigsamples per second.

The digitally processing may comprise processing sequential time samples representing the radio frequency field, to estimate a waveform of the interfering signal, and selectively digitally removing the estimated waveform of the interfering signal to produce the reduced interference signal.

The signal of interest may be substantially circularly polarized, and the interfering signal may be substantially linearly polarized. The at least one antenna may comprise at least two antenna elements configured to have a differential response pattern to circularly polarized and linearly polarized radio frequency fields within the narrow band.

The method may further comprise directly oversampling a signal representing the radio frequency field substantially without frequency translation.

The digitally processing may comprise nonlinearly transforming a representation of the radio frequency field.

The method may comprise Fourier transforming the reduced interference signal, and generating a spatial map corresponding to the reduced interference signal.

The method may further comprise estimating a vector direction of the interfering signal by averaging data over a significant fraction of an oscillation period.

A further object comprises providing an imaging method, comprising: generating an atomic nucleus-orienting magnetic field; sensing outputs of at least one antenna comprising a signal corresponding to a precession of nuclei within the magnetic field in response to the generated magnetic field and an interfering component over time; digitally processing the sensed outputs in a manner sensitive to a time correlation of the signal corresponding to a precession of nuclei within the magnetic field and the interfering component over time, at a rate oversampled with respect to a Nyquist rate of the interfering component; and generating an image corresponding to a spatial origin of the signal corresponding to a procession of nuclei within the magnetic field with algorithmically reduced contribution of the interfering signal.

A still further object provides a method of enhancing detection of a signal of interest in a magnetic resonance imaging system, by selectively measuring or estimating at least one interference signal, and digitally subtracting in a time domain representation the measured or estimated interfering signal from a composite signal comprising the signal of interest and the at least one interference signal. The composite signal may be analyzed for at least one of differences in frequency distribution, time, spatial distribution, and polarization direction to distinguish the interference signal from the signal of interest.

BRIEF DESCRIPTION OF THE FIGURES

FIG. 5 shows the Matlab code for a preferred embodiment of the digital polarized noise cancellation method to cancel the noise component $B_n$.

DETAILED DESCRIPTION OF THE PREFERRED EMBODIMENTS

Figure 1:
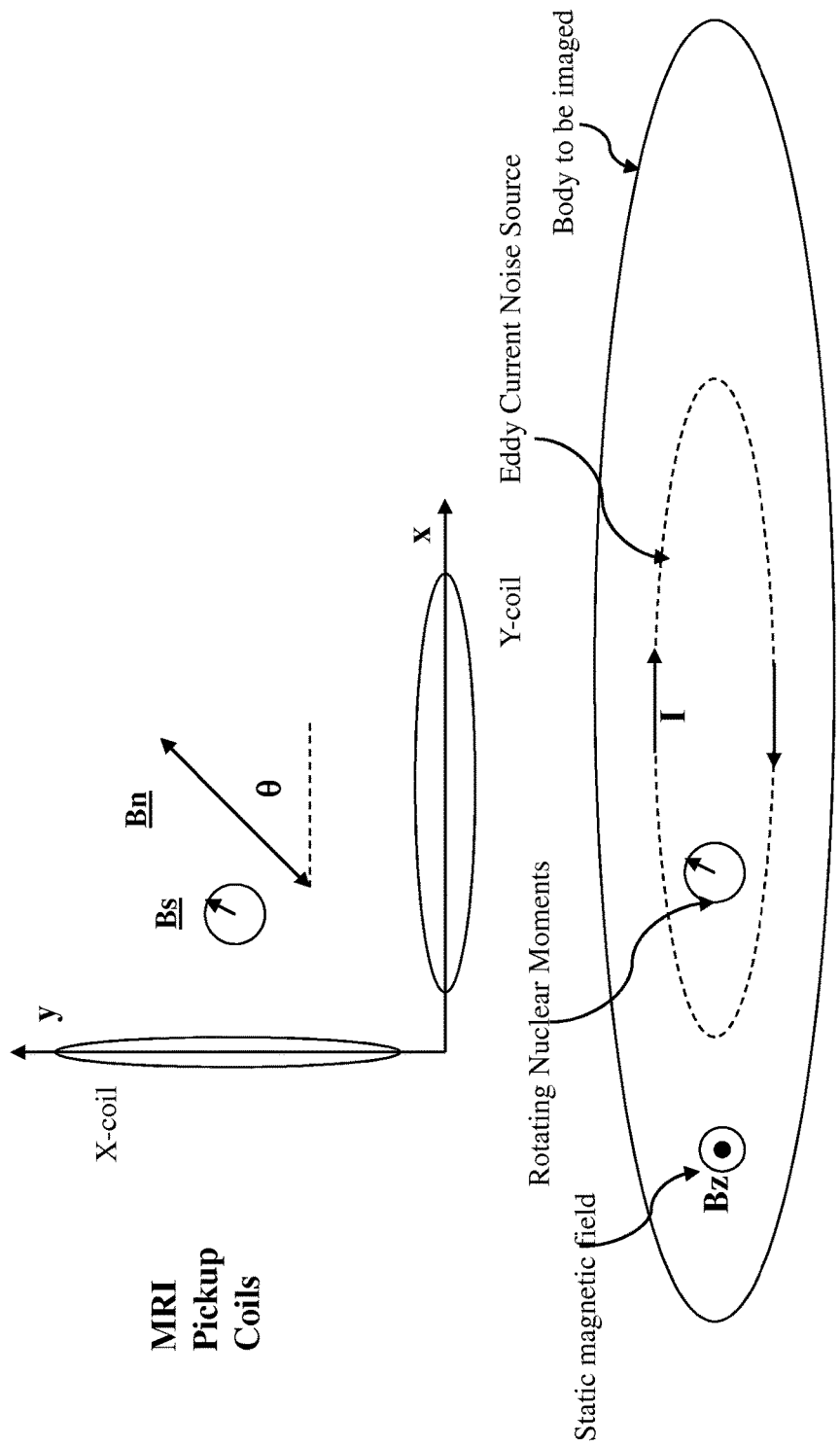
FIG. 1 shows the configuration of quadrature pickup coils and component magnetic fields of signal $B_s$ and noise $B_n$, where $B_s$ is circularly polarized and $B_n$ is linearly polarized.

In classic MRI, as shown in FIG. 1, a large static uniform magnetic field is applied in the z-direction, in order to polarize the magnetic nuclei in the object to be imaged (usually a part of a human body) along the z-axis. An RF transmit coil applies an RF field that causes the nuclei to rotate (precess) around the z-axis, generating RF magnetic fields that rotate in the x-y plane at the Larmor frequency. Small quasi-static magnetic field gradients are applied that shift this frequency slightly, depending on position. A coil placed near the body (the y-coil in FIG. 1) measures this narrow-band signal, which is subsequently amplified and Fourier-transformed to recover the positional information. In addition to the nuclear resonance signal, broadband fluctuating eddy currents in the body also produce RF magnetic fields in the pickup coil, but for a single current dipole noise source, these noise fields are linearly polarized rather than circularly polarized as for the nuclear magnetic fields. FIG. 1 shows a single eddy current loop, but in general there may be multiple loops that contribute to the noise magnetic field, which may be uncorrelated. The pickup coil and subsequent receiver are generally narrow-band in conventional MRI systems, and select only the components of noise that lie within the signal band of interest. This restriction is relaxed in systems employing embodiments of the invention.

While the prior art has developed arrays of coils that selectively detect different parts of the signal, one aspect of the present invention focuses on detecting and cancelling out the body noise. In one aspect of the invention, this is done using at least one additional coil, for which a perpendicular quadrature coil (the x-coil in FIG. 1) is a preferred embodiment. The analysis above indicated that the quadrature coil is identical to the main coil, but this need not be the case, and in fact, the coil must be carefully designed to best match the spatial dependence of the noise and signal fields, which fall off as one moves away from the body in the y-direction. So for example, one may preferably use a quadrature coil that is at a similar distance from the body as the primary coil (y-coil), with adjustments in area and scaling factor to match the signal amplitudes in the two coils. Alternatively, one or more additional quadrature coils can be used, at different locations. In this way, one may combine the outputs of the several coils to achieve the best noise cancellation.

The signals from the two quadrature coils can be combined in several ways. For example, the prior art has taught that one may add the outputs with a 90° ($\pi$/2 radian) delay, to enhance the signal. Taking Eqs. (1) and (2) above, $$B_x(t-\pi/2\omega)+B_y(t)=2B_{s0}\sin(\omega t+\phi_s)+B_{n0}[\cos(\theta)\sin(\omega t+\phi_n)+\sin(\theta)\cos(\omega t+\phi_n)]=2B_{s0}\sin(\omega t+\phi_s)+B_{n0}\sin(\omega t+\phi_n+\theta) \quad (11)$$

But this combination does not help to isolate the noise. Alternatively, one may subtract these same two components to cancel the signal:

$$B_x(t-\pi/2\omega)-B_y(t)=B_{n0}\sin(\omega t+\phi_n-\theta) \quad (12)$$

This permits one to determine directly the amplitude of the body noise, assuming only that the body noise is linearly polarized (LP) and that the receiver noise is negligible. Eq. (12) can also be used together with an estimate of the angle $\theta$ (as described above for Eqs. (8) and (9)) to subtract off the noise from either Eq. (1) or (2), as an alternative to applying Eq. (10).

Figure 3:
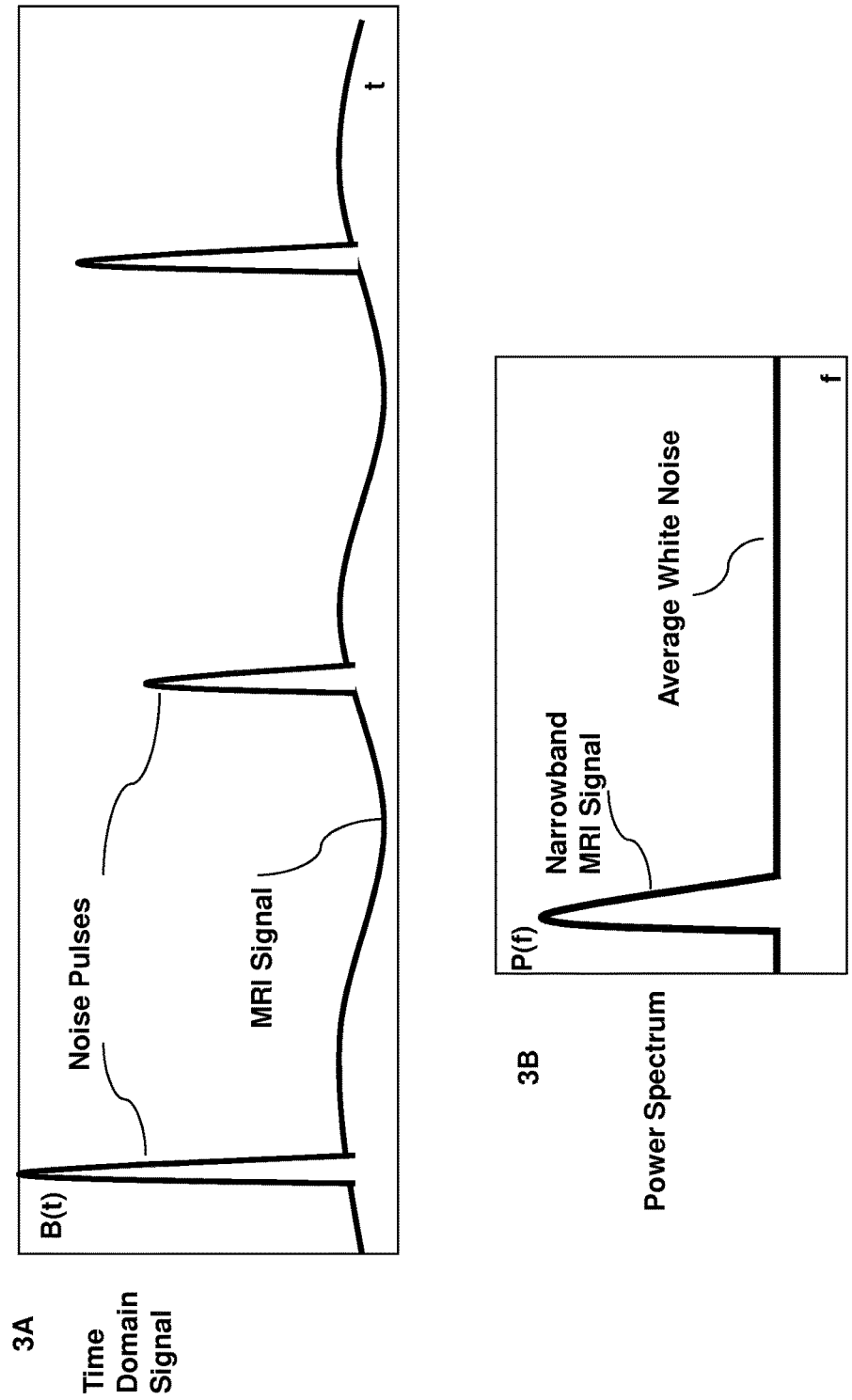
FIG. 3 shows a concept of a broadband signal from an MRI system comprising both a narrow-band MRI signal of interest and a larger series of interfering narrow pulses, in both the time domain (FIG. 3A) and the frequency domain (FIG. 3B).

The polarization of the signal in MRI is well known to be circularly polarized. However, the polarization of the noise in MRI does not seem to have been carefully investigated in the prior art. The body noise is believed to be due to one or more eddy currents in the lossy conducting body, and each such source creates a linear polarized (LP) magnetic field. The temporal profile of an eddy current in biological tissue is not well characterized, but may be modeled by a fast current pulse, as indicated in FIG. 3A. The orientation, location, amplitude, and phase of these thermally-activated currents will change with time. If there is a single dominant source (or correlated eddy currents over a large volume), then the noise is likely to be predominantly LP. Bandpass filtering would not be expected to alter the field polarization from such a body noise source.

The most general polarization from a superposition of multiple uncorrelated LP sources will be elliptically polarized (EP). Circular polarization (CP) is a special case of EP where there are two perpendicular components that are equal in magnitude and 90° out of phase. This is possible but generally unlikely for random fields. If the noise is CP at some time, then the method described here will not be effective at reducing this noise. However, more likely is the EP case where the amplitude along the major axis is several times larger than that along the minor axis. In this case as well, substantial reduction in noise is possible. However, a circularly polarized (CP) component of the noise will tend to group with the CP signal rather than with the LP noise in this method. Furthermore, there may also be CP random noise in the nuclear spins, although this is believed to be much smaller than the noise associated with the current dipoles.

While the invention has been illustrated for two antennas oriented in perpendicular directions, this can be easily extended to any other fixed angle $\beta$. In that case, the phase delay for the CP signal would be $\beta$, and the corresponding projections of the LP noise vector would be $\cos(\theta)$ and $\cos(\theta-\beta)$. Estimating these same factors would enable noise cancellation similarly to that shown in Eqs. (1-4). Furthermore, other algorithms may be employed that are based on distinguishing a coherent CP signal from a varying LP noise source.

Figure 2:
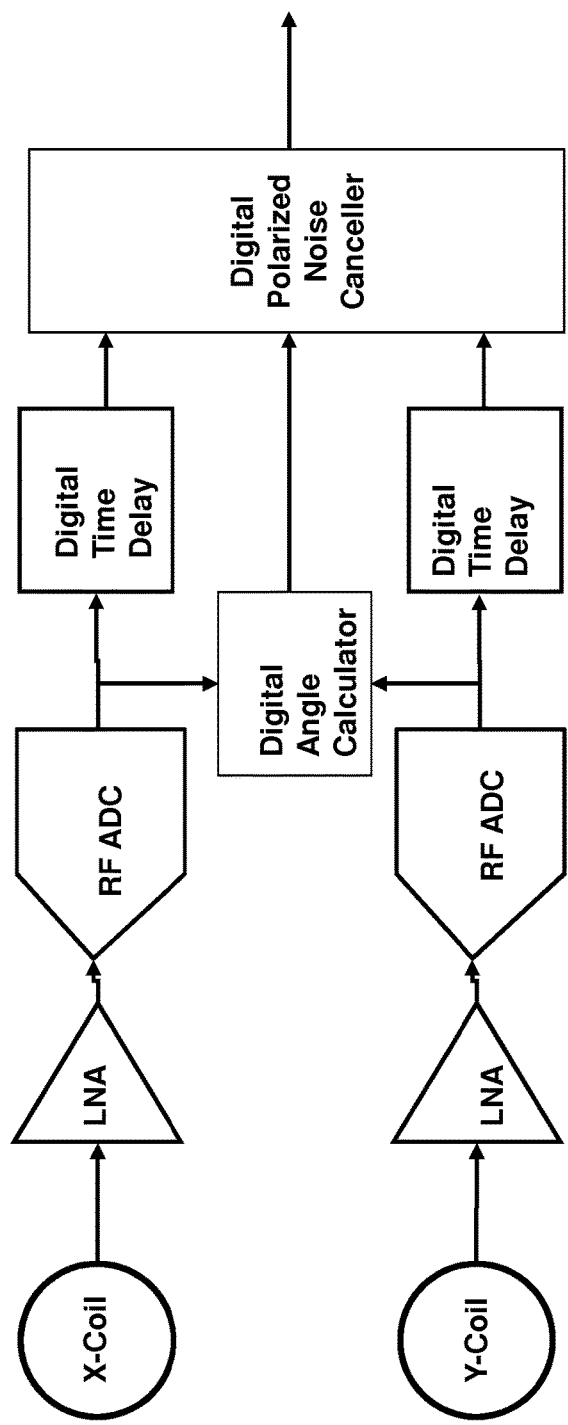
FIG. 2 shows a block diagram of a digital receiver system employing polarized noise cancellation.

FIG. 2 presents a simplified block diagram of a preferred system embodying the polarization noise reduction approach of an embodiment of the invention. This shows direct digitization of the RF signal from each of the quadrature coils, followed by a time-domain calculation of the direction $\theta$ of the polarized noise signal in a particular time-sequence of data from both channels. This value of $\theta$ is then used together with the same time-sequence of data in both channels to cancel the noise, for example as described in the equations above. The digital time-sequences of data are stored in an appropriate memory buffer, or otherwise delayed in a pipelined fashion. This digital time delay shown in FIG. 2 is distinct from a 90° phase delay as in quadrature receivers of the prior art. Furthermore the digital polarized noise canceller does not simply add the signals from the two channels. A full digital processor may be employed that comprises trigonometric functions and time-shifting, among other operations. These digital processing operations may be carried out in a general-purpose microprocessor operating, e.g., at room temperature, (if it is fast enough), or alternatively in a specialized programmable DSP chip, field-programmable gate array (FGPA), or other fast digital integrated circuit with memory buffers. Note also that for this technique to work properly, the noise contribution from the pickup coil, LNA, and digital receiver are preferably all small compared to the body noise. Otherwise, the noise correlations between the two channels will be reduced.

A conceptual picture that distinguishes the temporal nature of the MRI signal and broadband body noise is shown in FIGS. 3A and 3B. FIG. 3A shows this for an idealized broadband receiver in the time-domain. The equivalent time-averaged frequency dependent power spectrum is shown in FIG. 3B. Each narrow pulse in FIG. 3A represents the transient magnetic field from a thermally excited current dipole in the electrically conducting body. These dipoles die out very quickly (~1 ns) due to the lossy nature of ionic flow in the body, and represent a very low-Q system. The Fourier transform of a narrow pulse is a flat spectrum (white noise) up to a cutoff frequency that is of order the reciprocal of the pulsewidth (GHz range). In contrast, the rotating magnetic moments in the atomic nuclei are only very weakly coupled to the conducting medium, and represent a very high-Q system, as shown by the sinewave in FIG. 3A and the narrowband signal in FIG. 3B. This sharp contrast in physical properties has not been exploited in MRI systems of the prior art. Note that the narrowband filtering present in a conventional narrowband MRI receiver will broaden these narrow pulses in a way that may make them practically indistinguishable from the narrowband MRI signal.

Figure 4:
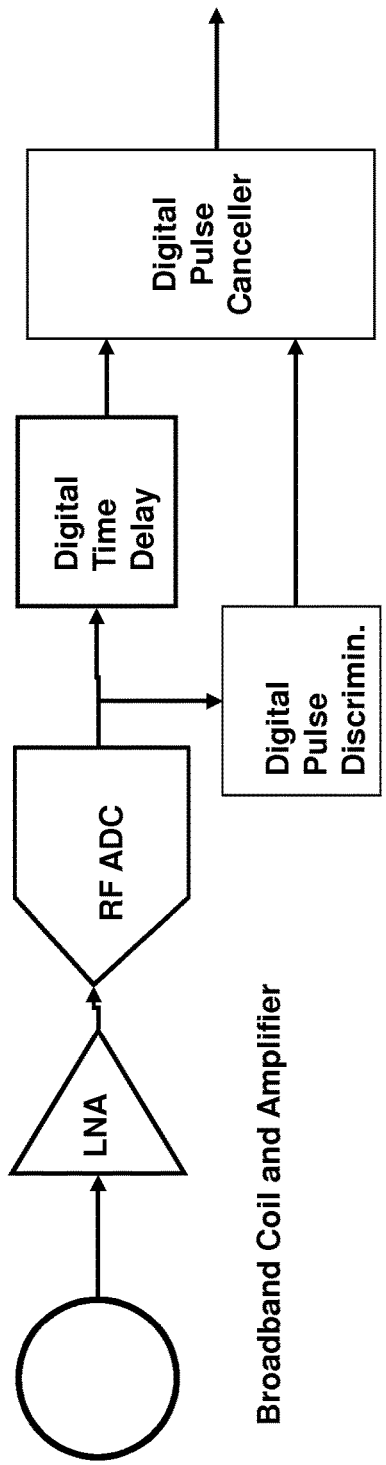
FIG. 4 shows a block diagram of a broadband digital receiver system employing digital noise pulse cancellation.

An alternative preferred embodiment of the invention, that enables detection and cancellation of the body noise narrow pulses, is shown in the block diagram of FIG. 4. Here we assume that the coil and low-noise amplifier (LNA) may be sufficiently broadband to permit discrimination of individual pulses in the time domain. A very broadband RF ADC (<10 MHz to >2.5 GHz) is used to digitize the entire signal, followed by a digital pulse discrimination circuit that identifies narrow pulses. A digital pulse cancellation module is then used to subtract off the narrow pulse and interpolate the background data, thus sharply reducing the body noise present in the signal. A model-based filter may also be employed to consolidate these processes. This signal can subsequently be digitally downconverted and filtered to obtain a digital baseband signal with a substantial increase in the useful MRI signal-to-noise ratio (SNR) that can be used either to increase imaging resolution or to speed up scans.

The average pulse frequency of the current dipole pulses has not clearly been identified, but will depend on the volume of the body that is coupled to the pickup coil. In general, smaller coils will receive less body noise, with a greater time delay between pulses. If the pulses are broadened or overlap substantially in time, the digital pulse cancellation approach may be unable to work effectively. For this reason, this method is likely to be most applicable for small coils, such as are used in MRI of small animals, or alternatively in human-scale systems comprised of an array of pickup coils. Such parallel arrays of small coils (e.g., a two-dimensional array of surface coils) have increasingly been used in the recent prior art as a method to enhance the scan rate and increase the effective SNR. Furthermore, conventional MRI systems typically use narrowband resonant pickup coils to minimize system noise; these might be modified to be compatible with the broadband noise signal discrimination system in this preferred embodiment of the invention.

Figure 6:
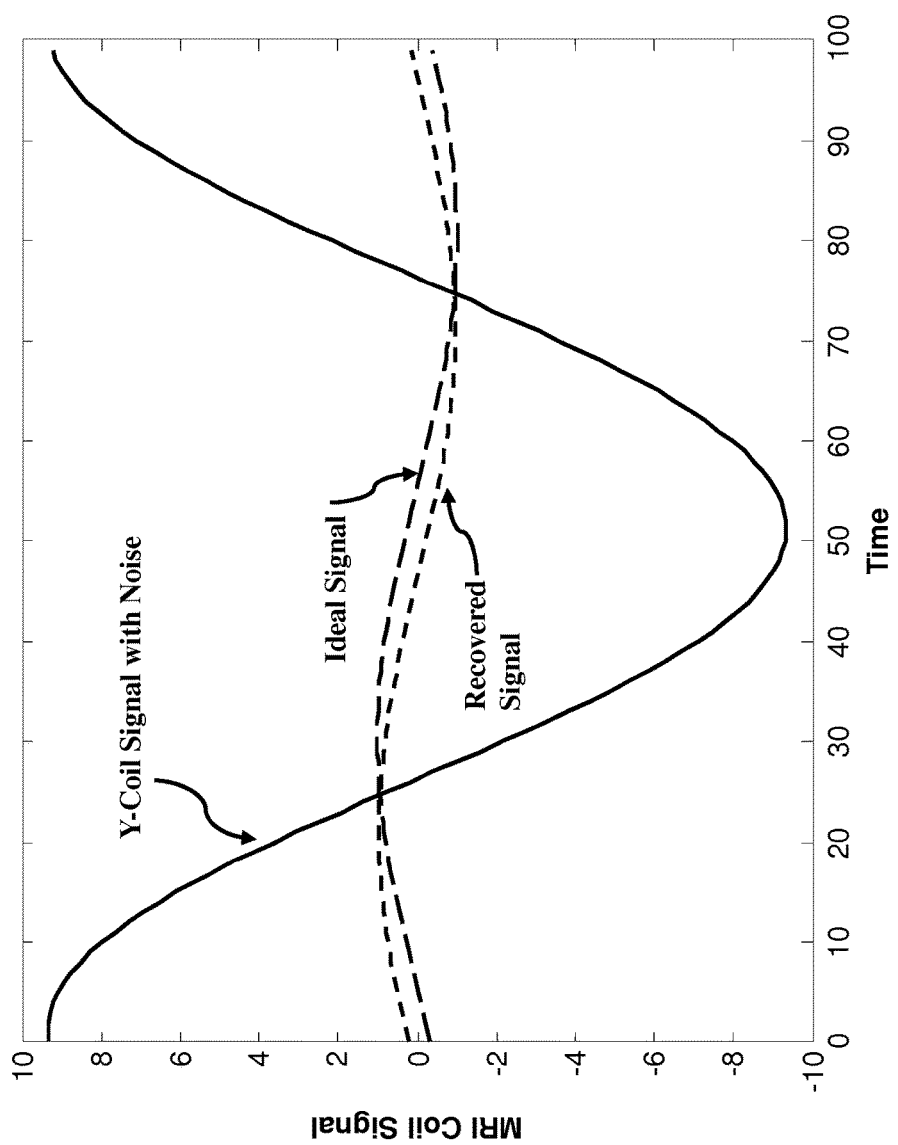
FIG. 6 shows the simulated time dependence of the noisy signal, recovered signal, and ideal signal according to a preferred embodiment of the method, with a linearly polarized noise signal, showing almost complete cancellation of the noise.

A Matlab program is provided which demonstrates the principle of the algorithm for polarized noise reduction, shown in FIG. 5. The program is simulated according to Eqs. (1)-(9), for a CP signal and LP noise, with two quadrature receiver coils labeled Vx and Vy. The time vector covers 100 steps in a single RF period, with t1 the normalized time vector in radians. In this example, the CP noise vector amplitude is 10 times larger than the signal amplitude (which is normalized to unity). The noise orientation angle is $\theta=60°$, its phase angle $\phi_n=0$, and the signal phase angle for the signal $\phi_s=40°$. FIG. 6 shows the time dependence of the received signal Vy, and also of the CP signal without the noise ("ideal signal"). It also shows the signal recovered from Vx and Vy, using the algorithm to estimate $\theta$. The recovered signal is similar in amplitude to the ideal CP signal, with a similar but not identical phase. This algorithm averages $\cos(\theta_{est})$ and $\sin(\theta_{est})$ separately over the 100 steps of the entire period, and works equally well for angles that are either positive or negative.

Figure 7:
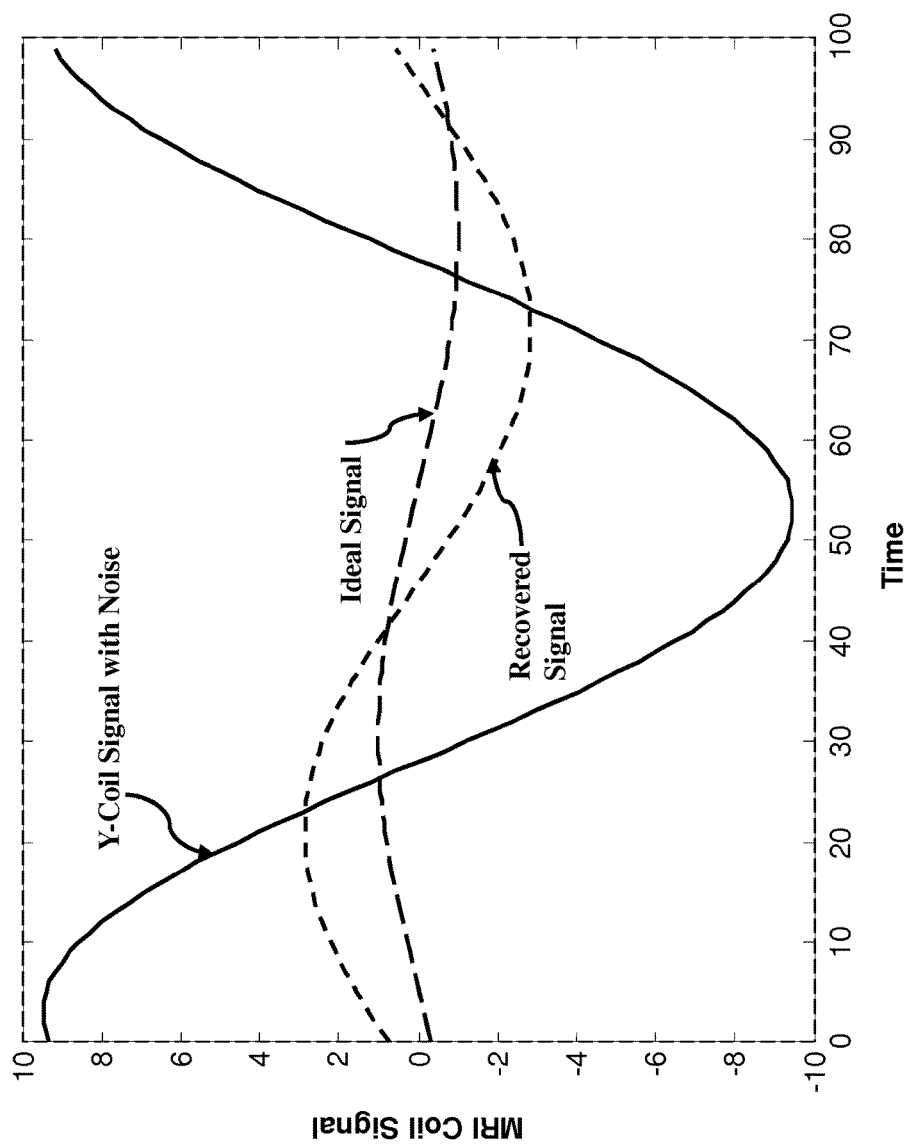
FIG. 7 shows the simulated time dependence of the noisy signal, recovered signal, and ideal signal, with an elliptically polarized noise signal, showing partial reduction of noise.

More generally, the body noise may be elliptically polarized (EP) rather than LP. For example, the simulation shown in FIG. 6 has been modified to include an EP noise signal, with an amplitude of 10 along the major axis at an angle $\theta=60°$ from the x-axis, and an amplitude of 2 along the minor axis perpendicular to this. This is essentially equivalent to a CP noise signal of amplitude 2 together with an LP noise signal of amplitude 8. The results of the EP-noise simulation are shown in FIG. 7. They indicate, as one might expect, that the algorithm succeeds in cancelling the LP portion of this noise, but the CP portion remains.

The analysis and algorithm described thus far have dealt with the case where the signals are sampled and averaged at the RF frequency, over a full period. In some cases, this would require digital sampling and computing at a very high frequency, which may be impractical. For example, if the RF frequency is 100 MHz, the direct sampling would require digital processing at multi-GHz rates. While this is possible with advanced digital processors (using, for example, ultra-fast superconducting RSFQ circuits, see U.S. Pat. No. 7,443, 719), such rapid processing may not be necessary. In most cases, the signals to the two receivers are both narrow-band, with a typical bandwidth that may be BW=50 kHz or less. The amplitude and phase of the signals cannot change significantly over a time of order $½πBW∼3$ µs, much greater than the RF period of 10 ns. So any sub-sampling (with a fast sample-and-hold circuit) that samples the signal at a diversity of points within its cycle would also be effective, provided only that the samples included in the average are within the bandwidth-time. This makes the algorithm more readily achievable using real-time computation.

Alternatively, any downconversion technique that retains both the amplitude and phase factors would enable application of the present algorithm at lower speeds, provided that there are sufficient samples over a downconverted period for an appropriate average. That is, envelope detection alone is not enough, but this combined with coherent phase detection would be sufficient. Most MRI receivers use an analog heterodyne receiver with an ADC digitizing the IF output. Such an output would be sufficient for application of the preferred polarized noise reduction algorithm of the present invention, provided that it oversamples the BW by a sufficient factor (e.g., at least about 10) to obtain a diversity of points for the average.

In a practical implementation of the invention, the noise reduction algorithm may be applied to real-time data from the receive antennas, with a pipelined memory buffer to permit active tracking of the noise field direction and real-time correction of the signal, with only a small time-delay. Such an algorithm may be programmed in a fast microprocessor, or alternatively in a custom integrated circuit such as a field-programmable gate array (FPGA). The linearity and dynamic range of the ADC should be compatible with both the weak signal of interest and the strong noise, and the digital circuit should have enough bits for both. The system may be implemented within known computers or automated data processing systems consistent with the requirements herein. The program code for instructing a programmable processor may be stored on or in various computer readable media, or be integral with the design of the processor.

Noise reduction is important in MRI, because a good signal to noise ratio (SNR) can be used either to improve the ultimate spatial resolution, or to speed up the imaging time. Increasing the static magnetic field increases the SNR by increasing the signal magnitude, but it may cause other problems. For example, very large magnets require new systems with extreme homogeneity, and tend to be quite expensive. An alternative strategy is to increase the SNR by decreasing the noise, and decreasing the background body noise is one way to achieve this. The approach of the present invention can be applied to conventional MRI systems, without major modifications in hardware or data processing (although a broader bandwidth receiver may be necessary in some cases). Likewise, other biological signal processing systems may benefit from this technique, which can distinguish signal sources with different polarization and temporal characteristics through use of a plurality of antennas or a complex antenna to detect the signal source characteristics. A module incorporating a noise-reduction algorithm could accept the downconverted quadrature pair signals, and produce an output which goes to a conventional image generating processor that typically uses fast-Fourier transforms to generate spatial information.

An alternative approach is to make use of systems with low- and ultra-low-magnetic fields. These have generally been considered impractical, because the signal is weaker and thus the SNR is too small for a fast, high-resolution image. There has been progress recently in the development of low-noise coils and receivers, in some cases involving cryogenic temperatures. However, the success of this approach may be limited by the body noise, which in practical situations may limit the SNR even if the receiver noise is reduced. In such a regime, the use of digital noise reduction techniques as described in the present application to reduce the body noise will be particularly valuable.

This noise-reduction method may not be limited to magnetic resonance imaging. It may also apply in other situations where one is trying to detect a weak circularly polarized signal field in the presence of a stronger linearly polarized noise field, or where a narrowband signal is dominated by noise from broadband pulses. This may be the case, for example, in spectroscopy for nuclear magnetic resonance or nuclear quadrupole resonance. It may also be relevant for certain communications or radar protocols, where the transmitted signal may be circularly polarized.

What is claimed is:

1. A magnetic resonance imaging processing system, comprising:
    at least one automated digital processor, configured to:
        process magnetic resonance data derived from at least two antennas having different orientations with respect to a radio frequency magnetic field from an imaging region, representing each of a phase coherent narrowband oscillating signal of interest, and a broadband interfering signal from a current dipole having at least one component within the narrow band of the signal of interest, based on at least a time-correlated model of the broadband interfering signal from the current dipole, correlating portions of the broadband interfering signal from the current dipole outside the narrow band of the signal of interest with the at least one component within the narrow band of the signal of interest, and
        generate a reduced interference signal having a reduced interference of the broadband interfering signal from the current dipole with the signal of interest; and
    a memory, configured to store the reduced interference signal,
    wherein the signal of interest is substantially circularly polarized, the broadband interfering signal from the current dipole is substantially linearly polarized, and the at least two antennas have a differential response pattern to circularly polarized and linearly polarized radio frequency magnetic fields within the narrow band from the imaging region.

2. The system according to claim 1, wherein the at least two antennas are configured to distinguish a spatial characteristic of a radio frequency magnetic field from the imaging region.

3. The system according to claim 1, wherein the at least two antennas are configured in a two dimensional array, each element of the array having a different respective spatial sensitivity.

4. The system according to claim 1, wherein the broadband interfering signal from the current dipole comprises at least one pulse, and wherein the at least one automated processor is configured to perform a time domain analysis of the magnetic resonance data.

5. The system according to claim 1, wherein the at least one automated processor is configured to perform a frequency domain analysis of the magnetic resonance data.

6. The system according to claim 1, wherein the at least one automated processor is configured to perform a correlation analysis of the broadband interfering broadband signal from the current dipole within the narrow band with components of the broadband signal from the current dipole outside of the narrow band.

7. The system according to claim 1, wherein the at least one automated processor is configured to process sequential time samples representing the radio frequency magnetic field, to estimate a time domain waveform of the broadband interfering signal from the current dipole, and to selectively digitally remove the estimated waveform of the broadband interfering signal from the current dipole, from the magnetic resonance data to produce the reduced interference signal.

8. The system according to claim 1, further comprising an automated output processor configured to process the reduced interference signal receive and to generate a spatial map corresponding to the reduced interference signal.

9. The system according to claim 1, where the at least two antennas are together configured to generate at least two quadrature-related radio frequency magnetic resonance signals from the radio frequency magnetic field.

10. The system according to claim 1, wherein the at least one automated processor is configured to produce the signal having the reduced interference of the broadband interfering signal from the current dipole with the signal of interest within the narrowband by greater than 3 dB.

11. The system according to claim 1, further comprising at least one analog-to-digital converter configured to directly oversample a signal from a respective antenna representing the radio frequency magnetic field without frequency translation.

12. The system according to claim 11, wherein the analog-to-digital converter samples at a multi-GHz rate.

13. The system according to claim 1, wherein the at least one automated processor is configured to perform a nonlinear transformation on a representation of the radio frequency field.

14. A magnetic resonance imaging processing method, comprising:
receiving magnetic resonance data as at least two signals, derived from at least two antennas having different orientations with respect to a radio frequency magnetic field from an imaging region, representing a vector sum of a phase coherent narrowband oscillating signal of interest which is predominantly circularly polarized, and a broadband interfering signal from a current dipole which comprises at least one linearly polarized component having at least one component within the narrow band of the signal of interest, projected in at least two directions;
digitally correlating portions of the broadband interfering signal from the current dipole outside the narrow band of the signal of interest with the at least one component within the narrow band of the signal of interest to generate a time-correlated model of the broadband interfering signal from the current dipole;
processing the received magnetic resonance data as the at least two signals based on at least the time-correlated model of the broadband interfering signal from the current dipole, to separate the signal of interest, from the broadband interfering signal from the current dipole, based on a spatial difference therebetween, to produce a reduced interference signal having a reduced interference of the broadband interfering signal from the current dipole with the signal of interest; and
storing the reduced interference signal in a memory,
wherein the signal of interest is predominantly circularly polarized, and the broadband interfering signal from the current dipole comprises at least one linearly polarized component, further comprising:
receiving from the at least two antennas at least two signals representing a respective vector sum of the signal of interest and the broadband interfering signal from the current dipole, projected in at least two directions; and
analyzing the at least two received signals, to separate out the signal of interest from the broadband interfering signal from the current dipole based on a spatial difference therebetween.

15. The method according to claim 14, wherein the at least two antennas comprise a plurality of antenna elements configured in a two dimensional array, each element of the array having a different respective spatial sensitivity.

16. The method according to claim 14, wherein the broadband interfering signal from the current dipole comprises at least one pulse, and wherein the processing comprises time domain processing of a time sequence of digital data representing the sensed radio frequency field at a sample rate in excess of 2.5 gigasamples per second.

17. The method according to claim 14, wherein:
the at least two antennas are oriented to sense a radio frequency field with different electromagnetic vector components;
the at least two antenna elements are configured to have a differential response pattern to circularly polarized and linearly polarized radio frequency fields within the narrow band; and
the processing comprises processing a time series representing a radio frequency field sensed by the at least two antennas, and generating a digital output signal that increases a ratio of the signal of interest and noise comprising the broadband interfering signal from the current dipole;
further comprising generating a spatial map corresponding to the reduced interference signal.

18. A method of enhancing detection of a signal of interest in a magnetic resonance imaging system, comprising:
receiving magnetic resonance vector information from at least two antennas having different orientations with respect to a radio frequency magnetic field from an imaging region, representing a phase coherent signal of interest within a band, and an interference signal overlapping the band from a current dipole;
digitally correlating portions of the interference signal within the band with at least one component of the interference signal outside the band;
selectively estimating a vector direction of the interference signal; and
digitally subtracting the interference signal within the band based on at least the estimated vector direction and the correlation of the portions of the interference signal within the band with at least one component of the interference signal outside the band, from the received magnetic resonance vector information, to generate a filtered signal, wherein the signal of interest is substantially circularly polarized, the interfering signal overlapping the band from the current dipole is substantially linearly polarized, and the at least two antennas have a differential response pattern to circularly polarized and linearly polarized radio frequency magnetic fields within the band from the imaging region.

* * * * *